United States Patent
Nohara et al.

(10) Patent No.: US 9,502,631 B2
(45) Date of Patent: Nov. 22, 2016

(54) METHOD OF MANUFACTURING END-GROUP COMPONENTS WITH PURE NIOBIUM MATERIAL FOR SUPERCONDUCTING ACCELERATOR CAVITY

(71) Applicants: SHINOHARA PRESS SERVICE CO., LTD., Funabashi-shi, Chiba (JP); Inter-University Research Institute Corporation, Tsukuba-shi, Ibaraki (JP); Kiyohiko Nohara, Chiba-shi, Chiba (JP)

(72) Inventors: Kiyohiko Nohara, Chiba (JP); Masayuki Shinohara, Funabashi (JP); Nobuyuki Kawabata, Funabashi (JP); Hideyoshi Nakamura, Funabashi (JP); Hitoshi Hayano, Tsukuba (JP); Akira Yamamoto, Tsukuba (JP); Takayuki Saeki, Tsukuba (JP); Shigeki Kato, Tsukuba (JP); Masashi Yamanaka, Tsukuba (JP)

(73) Assignees: SHINOHARA PRESS SERVICE CO., LTD., Funabashi-shi, Chiba (JP); INTER-UNIVERSITY RESEARCH INSTITUTE CORPORATION, Tsubaki-shi, Ibaraki (JP)

( * ) Notice: Subject to any disclaimer, the term of this patent is extended or adjusted under 35 U.S.C. 154(b) by 98 days.

(21) Appl. No.: 14/447,934

(22) Filed: Jul. 31, 2014

(65) Prior Publication Data
US 2015/0020561 A1    Jan. 22, 2015

Related U.S. Application Data

(63) Continuation of application No. PCT/JP2013/052516, filed on Feb. 4, 2013.

(30) Foreign Application Priority Data

Feb. 2, 2012  (JP) ................ 2012-020731

(51) Int. Cl.
*B21D 22/20* (2006.01)
*H01L 39/24* (2006.01)
*H05H 7/20* (2006.01)

(52) U.S. Cl.
CPC ......... *H01L 39/2406* (2013.01); *B21D 22/201* (2013.01); *B21D 22/208* (2013.01); *H05H 7/20* (2013.01); *B21D 22/20* (2013.01)

(58) Field of Classification Search
CPC .... H05H 7/20; H01L 39/2406; B21D 22/20; B21D 22/201; B21D 22/28; B21D 22/30; B21D 24/04; B21D 24/10; B21D 22/208
See application file for complete search history.

(56) References Cited

U.S. PATENT DOCUMENTS 2,958,659 A     11/1960  Brown
5,576,113 A  *  11/1996  Hirofumi ........... B21B 3/02
                                                428/679

(Continued)

FOREIGN PATENT DOCUMENTS

JP     54-142168 A    11/1979
JP     54-142462 A    11/1979

(Continued)

OTHER PUBLICATIONS

"Characterization and Development of an Evolutionary yield function", Zamiri et al. published Jul. 2007.*
"Study of a drawing quality sheet", Charca Ramos et al. published Apr. 2010.*

(Continued)

*Primary Examiner* — Edward Tolan
(74) *Attorney, Agent, or Firm* — Westerman, Hattori, Daniels & Adrian, LLP

(57) ABSTRACT

End-group components for superconducting accelerator cavity used in acceleration of charged particles are manufactured by subjecting pure niobium sheet materials to press forming composed mainly of flat-bottomed cylindrical drawing, preferably by simultaneously conducting control of slide velocity and/or its motion and control of tool die temperature and/or its distribution/gradient in the above press forming, further preferably by dynamically controlling blank holding force in accordance with the variation of flange area, flange thickness and deformed characteristics of niobium sheet materials during the press forming, more preferably by preparing an anisotropically shaped blank instead of a circular blank by use of servo press forming machine, servo-die cushion temperature control equipment, water-soluble solid coating type lubricant, and a tooling die.

11 Claims, 16 Drawing Sheets

(56) References Cited

U.S. PATENT DOCUMENTS

| | | | | |
|---|---|---|---|---|
| 5,630,337 | A * | 5/1997 | Werth | B21D 22/28 |
| | | | | 72/349 |
| 6,097,153 | A * | 8/2000 | Brawley | H05H 7/20 |
| | | | | 219/121.63 |
| 6,221,814 | B1 * | 4/2001 | Kaburagi | B28D 5/007 |
| | | | | 508/136 |
| 6,769,280 | B2 * | 8/2004 | Cao | B82Y 30/00 |
| | | | | 72/17.3 |
| 8,324,134 | B2 * | 12/2012 | Saito | H05H 7/20 |
| | | | | 148/96 |
| 8,915,108 | B2 * | 12/2014 | Rau | C10M 111/04 |
| | | | | 508/136 |
| 2002/0072475 | A1 * | 6/2002 | Michaluk | C22B 5/04 |
| | | | | 505/100 |
| 2006/0219336 | A1 * | 10/2006 | Myneni | H05H 7/20 |
| | | | | 148/668 |
| 2010/0126244 | A1 * | 5/2010 | Chien | B21D 22/06 |
| | | | | 72/350 |
| 2012/0291699 | A1 * | 11/2012 | Fonte | B21D 22/16 |
| | | | | 117/208 |

FOREIGN PATENT DOCUMENTS

| | | |
|---|---|---|
| JP | 62-176617 A | 8/1987 |
| JP | 11-309518 A | 11/1999 |
| JP | 11-309519 A | 11/1999 |
| JP | 2000-288641 A | 10/2000 |
| JP | 2003-088922 A | 3/2003 |
| JP | 2010-040423 A | 2/2010 |
| WO | 2011/142348 A1 | 11/2011 |
| WO | 2013/115401 A9 | 8/2013 |

OTHER PUBLICATIONS

Nohara, Kiyohiko, et al., "Strain Induced Transformation in Stainless Steel", Technology of Plasticity, Japan, 1997, vol. 18, No. 202, pp. 938-945.

Nohara, Kiyohiko, et al., "Warm Press Forming of Stainless Steel Sheet", Kawasaki Steel Technical Report, Japan, 1985, vol. 17, No. 3, pp. 315-322.

Nohara, Kiyohiko, et al., "Warm Press Forming of Stainless Steel Sheets", Proc. 1st. Int. Conf. on New Manufacturing Tech, 1990, pp. 533-538.

Nohara, Kiyohiko, "Stainless Steel and Press Forming", Press Technology, Japan, 2003, vol. 41, No. 1, pp. 18-27.

Hanaki, Koji, et al., "Speed Effects in Deep Drawing", ISIJ, Japan, 1987, vol. 7, pp. 761-769.

Ujihara, Shin et al., "Press Forming of Automobile Panels by the Control of Blank Holding Force", Technology of plasticity, Japan, 1992, vol. 33, No. 375, pp. 373-378.

Sennyu et al.,"Status of Superconducting Cavity Development for ILC at MHI", Proceedings of Linear Accelerator Conference, Nov. 17, 2011, pp. 121-123; Supplementary European Search Report dated Jan. 19, 2015.

Schumann et al., "Choosing a Lubricant for Deep Drawing", www.thefabricator.com, Feb. 19, 2001, 4 pages; Supplementary European Search Report dated Jan. 19, 2015.

International Search Report dated May 7, 2013, issued in counterpart application No. PCT/JP2013/052516 (w/English translation) (4 pages).

Written Opinion dated May 7, 2013, issued in counterpart application No. PCT/JP2013/052516 (4 pages).

Supplementary European Search Report dated Jan. 19, 2015, issued in counterpart application No. EP 13 74 3012 (3 pages).

\* cited by examiner $D_\theta$ : length at angle θ from rolling direction
S : area of blank necking Upper ear height    Lower ear height FIG.16
(a) Before secondary forming
(b) After secondary forming of protrusion on the cylindrical bottom
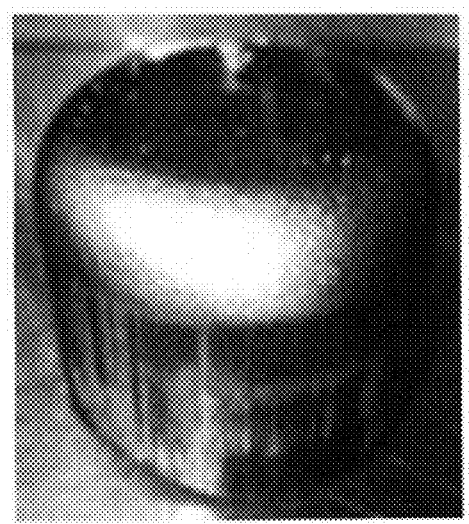
(c) Secondary forming (protrusion) processes
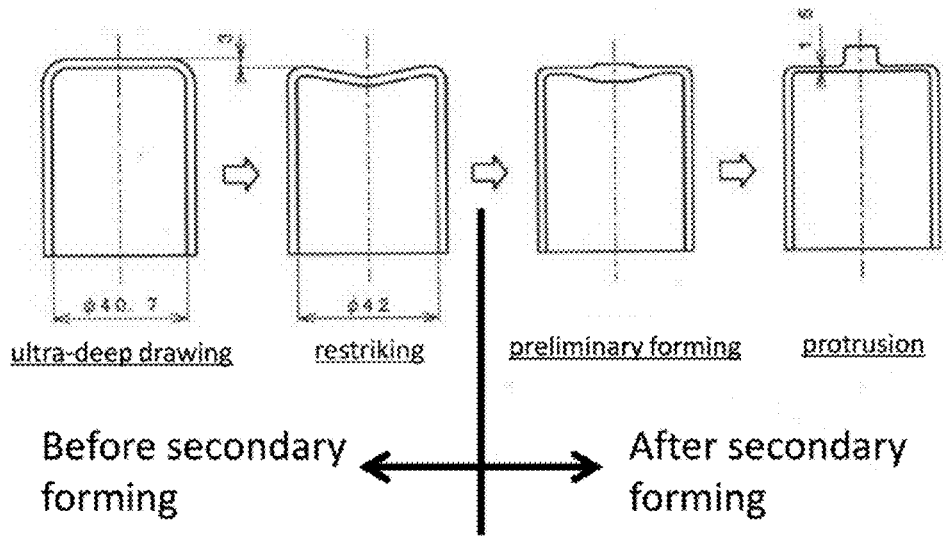
Before secondary forming ⟵⟶ After secondary forming FIG.17
(a) Eccentric perforation followed by burring
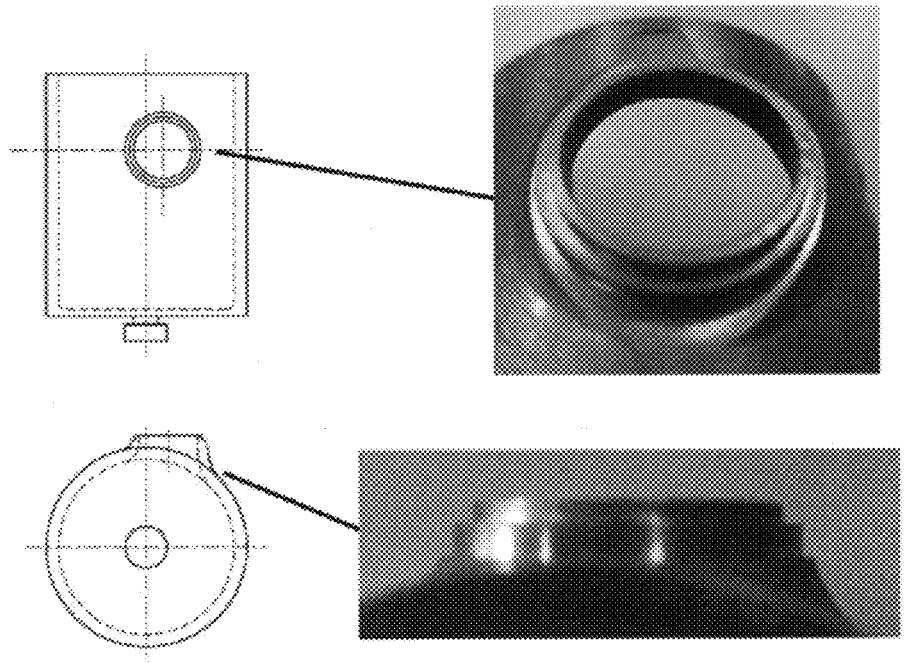
(b) Color check inspection
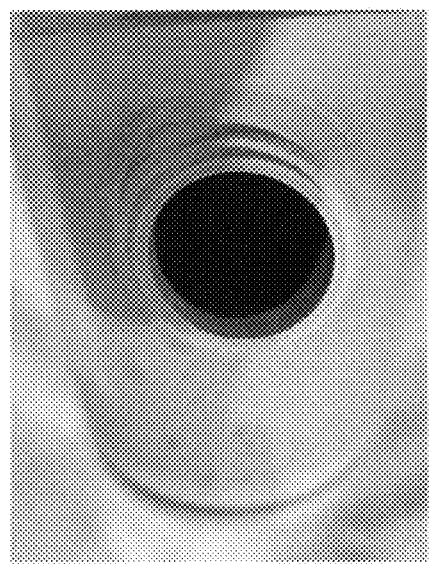

METHOD OF MANUFACTURING END-GROUP COMPONENTS WITH PURE NIOBIUM MATERIAL FOR SUPERCONDUCTING ACCELERATOR CAVITY

TECHNICAL FIELD

This invention relates to a method of manufacturing end-group components with a pure niobium material for superconducting accelerator cavity, which is used for the acceleration of (charged) particles in synchrotron or linac type accelerator.

RELATED ART

The superconducting accelerator cavity is designed to resonate a metallic cavity using a particular high frequency wave for accelerating (charged) particle beams close to the light speed by high frequency electric field in a high efficiency to collide the particles. It is mainly used in a charged-particle accelerator of synchrotron or linac type.

Heretofore, a metal showing a large heat conductivity and a small electric resistance (e.g. copper) has been used in the accelerator cavity for avoiding an influence of heat generation due to the input of high-frequency micro-wave. However, in order to meet the demand of further higher speed of charged particles, the accelerating field has been increased. As a result, the "normal-conducting" accelerating cavity wherein copper material has been implemented is limited in the desire performance of accelerating particles due to marked elevation of temperature. Therefore, lately alternative "superconducting" accelerating cavity has been proposed and put into practical use.

Pure niobium is selected as a metal for the new superconducting accelerator cavity from the following reasons in addition to its superconducting performance, and both the production techniques of the material and the forming techniques of components have been developed.

(1) The cavity components are massive bodies which differ from superconducting wire, so that it is desirable to be a pure metal in terms of workability.

(2) Among some candidate metals, pure niobium has the highest superconducting transition temperature of 9.2 K under atmospheric pressure. At a superconducting state, needless to say, electric resistance becomes zero, and heat generation and heat conduction do not come into problem.

(3) A high purity niobium belongs to one of transition metals and has a body-centered cubic lattice in a wide temperature range from a melting point to an extremely-low temperature, and is a stable material causing no phase transformation.

(4) Though the high purity niobium is a very soft material around room temperature, the lack of strength leads to poor workability. Also it forms a body-centered cubic lattice, and resultantly the work hardening is very high at low temperatures, to easily cause brittle fracture. However, it cannot be necessarily said that the working is impossible depending on technologies, conventional or innovative.

(5) Since the high purity niobium forms an oxide film in the air to show a corrosion resistance and an acid resistance, the handling at room temperature is not difficult.

Among the above properties of the high purity niobium, superconducting property is most important. That is, the possibility that a feasible acceleration voltage per unit length should be comparatively high is of significance. The superconducting property is dependent upon the purity, metallic structure (crystal grain size and texture) and the surface quality of niobium.

As for the purity of niobium, the RRR (residual resistivity ratio) of not less than 300 is being obtained by repeated electron beam melting.

The metallic structure is basically desirable after working and annealing rather than as-cast structure. Because, the as-cast structural grain is large in the aspect ratio and indicates metallic structure having a small grain boundary inclination, so that it is hardly said to be at a metallurgically stable state and there are problems in the material properties and workability; whereas the former case has a matrix of recrystallized structure showing large grain boundary inclination, so that it is at a metallurgically stable state and is advantageous in the material properties and workability. Also, it is an important point that the structure after the working and annealing is varied in accordance with the manufacturing conditions of the material. In other words, it is possible to control the change in its properties to a certain extent.

Also, the surface quality is important because the electric field generated in the superconducting accelerator cavity is based on the extremely-thin surface current. To this end, the surface of the niobium component is subjected to a chemical polishing, an electro-polishing or both of them.

As shown in FIGS. 1 and 2, the superconducting accelerator cavity comprises the nine cells of a center portion called "nine cell cavity unit", and Higher Order Mode (HOM) cup, port pipe, beam pipe, HOM antenna and the like at both ends of a unit called "end-group". The HOM cup is integrated into the HOM antenna, which is called HOM coupler. In short, each cavity unit plays a role of increasing acceleration voltage per unit length to make the particles collision at high energy as far as possible. Moreover, HOM is a higher order mode to act as a resonance mode impeding particle beam acceleration. The HOM coupler can well combine and suppress with higher order mode resonance.

Among the end-group components for the superconducting accelerator cavity, the HOM cup exhibiting a cylindrical shape and the port pipe/beam pipe alike seamless pipe, and so on could be manufactured, for example, by press forming procedures mainly subjected to drawing. They are important parts attached with both ends of proximately over 18000 "nine-cell cavity units" in "International Linear Collider" whose development and research works are in progress.

However, the manufacturing method of these end-group components has not yet been established on the industrial level. The biggest reason thereof is due to the fact that the difficulty of any kind of working with niobium is high as seen from the feature that seamless pipe is not manufactured with niobium.

As to the center portion of the superconducting accelerator cavity, Patent Document 1 discloses a method of manufacturing by slicing Nb sheet from an ingot into half cells followed by press forming and joining them by means of electron beam welding (EBW). However, this press forming is herein a conventional shallow drawing at room temperature, which is not a technique applicable to the manufacture of the end-group components.

For the sake of this purpose, the following three methods are now examined for establishing mass production of these end-group components.

(1) Method of manufacturing the components from a rod material only by machining (hereinafter may be called "full machining method").

(2) Method of manufacturing components by combining backward extrusion process of a rod material and following machining and heat treatment (hereinafter may be called "extrusion-machining-heat treatment method").

(3) Method of manufacturing the components by subjecting a sheet material to plural processes of press forming while conducting a heat treatment between the press forming steps (hereinafter may be called "plural press forming-heat treatment method").

In the manufacturing methods (1) and (2), however, the material to be worked is close to cast structure, so that even if an expensive machining tool is used, adhesion resulted from coarse crystal grains is easily caused to shorten the service life of the tool, and a long time is taken for the machining, the production efficiency is poor to inevitably lead to the increase of the production cost. Also, in the manufacturing method (2), there is a problem that mixed grain structure tends to be formed in the course of heat treatment. Further, in the manufacturing method (3), the sheet material is used but the press forming process and heat treatment are necessary to be conducted several times, so that there is a problem of causing the decrease of the productivity to invite the increase of the production cost.

The inventors have previously paid attention to the temperature dependence of strain induced martensitic transformation of metals and allays such as austenitic (γ) stainless steel or the like at room temperature, to be more details the temperature dependence of strength and elongation at ambient temperatures during deformation, and developed a "warm press forming method" which improves the drawing formability of the material. In short, this method is based on a technical idea that in the drawing process, a flange is warmed to reduce work hardening due to transformation and reduce its deformation resistance, and at the same time a punch shoulder having theoretically fracture risk is cooled to promote work hardening due to stress/strain induced transformation and increase fracture resistance of the punch shoulder, and further both treatments are properly balanced. As a result "warm press forming" improves the drawing formability (see FIG. 3, Patent Documents 2~7 and Non-patent Documents 1~6). In FIG. 3, herein, symbols $M_S$ and $M_d$ exhibit the temperatures particular in metallurgy: $M_S$ is the temperature where martensite transformation takes place without external force and $M_d$ is the temperature where martensite transformation is never caused even if fracture force is loaded, both typical with austenitic γ-stainless steel shown in the figure as JIS SUS 301, for instance.

PRIOR ART DOCUMENTS

Patent Documents

Patent Document 1: JP-A-2010-040423
Patent Document 2: JP-A-S54-142462
Patent Document 3: JP-A-S54-142168
Patent Document 4: JP-A-S62-176617
Patent Document 5: JP-A-H11-309518
Patent Document 6: JP-A-H11-309519
Patent Document 7: JP-A-2003-088922

Non-Patent Documents

Non-patent Document 1: Kiyohiko NOHARA and Hiroshi ONO: "Strain Induced Transformation in Stainless Steel", Technology of Plasticity, vol. 18(1997), No. 202, p. 938

Non-patent Document 2: Kiyohiko NOHARA and Hiroshi ONO: "Warm Press Forming of Stainless Steel Sheet", Kawasaki Steel Technical Report, vol. 17(1985), No. 3, p. 315

Non-patent Document 3: K. Nohara, Y. Watanabe and K. Yamahata: "Warm Press Forming of Stainless Steel Sheets", Proc. 1st. Int. Conf. on New Manufacturing Tech. (1990)

Non-patent Document 4: Kiyohiko NOHARA: "Stainless Steel and Press Forming", Press Technology, 41(2003), No. 1, p. 18

Non-patent Document 5: Koji HANAKI, Kenzo KATO: "Speed Effects in Deep Drawing", ISIJ (1987), p. 761

Non-patent Document 6: Shin UJIHARA, Youzo HIROSE: "Press Forming of Automobile Panels by the Control of Blank Holding Force", Technology of plasticity, 33(1992), p. 373

SUMMARY OF THE INVENTION

Task to be Solved by the Invention

However, since pure niobium does not cause stress induced martensite transformation like in the above austenitic stainless steel, the aforementioned techniques themselves cannot be applied to the present invention.

Also, since niobium is a high price material as a typical rare metal, it is necessary to establish a manufacturing method wherein the amount of the raw material used can be reduced to attain the cost reduction while maintaining the superconducting property, further the material should be of better quantity as possible by the proper manufacturing technology because of the presence of an inseparable relationship to its formability.

The invention has been made in view of the above problems accompanied with the conventional techniques and is to propose a new manufacturing method considering the properties of the raw material, which is suitable for manufacturing parts mainly by deep drawing among end-group components with pure niobium for superconducting accelerator cavity used in acceleration of (charged) particles.

Solution for Task

The invention developed for solving the above task is a method of manufacturing end-group components for superconducting accelerator cavity used in acceleration of (charged) particles, characterized by manufacturing an end-group component from a sheet material of pure niobium by press forming composed mainly of flat-bottomed cylindrical drawing (first invention).

Also, the manufacturing method of the end-group components according to the invention is characterized by the control of velocity and/or its motion of a slide and the control of temperature and/or its distribution/gradient of a die are simultaneously carried out during the press forming (second invention).

Furthermore, the manufacturing method of the end-group components according to the invention is characterized in that blank holding force is dynamically controlled in accordance with variation of flange area, flange thickness and deformed characteristics of the pure niobium sheet material during the press forming (third invention).

In addition, the manufacturing method of the end-group components according to the invention is characterized in that a blank of the pure niobium sheet material is non-circular anisotropic blank determined from the measured values of plastic strain ratio and the following power hypothetical equation (9):

$$D_\theta = D_0 (r_{45}/r_\theta)^J \qquad (9)$$

wherein $D_\theta$: a blank diameter of angles form rolling direction as a parameter, $D_0$: a circular blank diameter in a direction of angle 45° direction from rolling direction (originally a circular blank diameter in any direction, and actually showing $D_{45}$ in a non-circular blank formulated by the equation (9)), $r_\theta$: plastic strain ratio in a direction of an angle θ from rolling direction, J: constant (1/10~1/13) (fourth invention).

The manufacturing method of the end-group components according to the invention is characterized in that a lubricant used in the press forming is a water-soluble solid coating type wherein kinetic viscosity change on temperature between −50° C. and +300° C. is within a range of ±10% (fifth invention).

Also, the manufacturing method of the end-group components according to the invention is characterized in that restriking is conducted after the press forming/drawing (sixth invention).

Furthermore, the manufacturing method of the end-group components according to the invention is characterized in that any one of trimming, bottom protruding and burring is conducted after the press forming or the restriking (seventh invention).

Further, the manufacturing method of the end-group components according to the invention is characterized in that the press forming is carried out by using a press machine provided with a servomechanism capable of controlling the velocity and/or motion of the slide and a dynamic blank holder device capable of dynamically controlling the blank holding force, a temperature controlling device capable of controlling the temperature and/or distribution/gradient of the material to be worked, and a tool die (eighth invention).

Effect of the Invention

According to the invention, the end-group components for superconducting accelerator cavity can be manufactured by subjecting the pure niobium sheets materials to only the press forming without basically using machining, heat treatments and the like, so that the amount of high price pure niobium materials used can be reduced to attain a large reduction of the material cost. Furthermore, according to the invention, the number of forming processes is decreased to simplify the production process and the shortening of the production time is attained, so that the mass production can be made and the large reduction of the production cost can be realizable.

BRIEF DESCRIPTION OF THE DRAWINGS

FIG. 16 is a view showing protrusion as the secondary working.

FIG. 17 is a view showing the eccentric perforation followed by burring as the secondary working.

EMBODIMENTS FOR CARRYING OUT THE INVENTION

Figure 1:
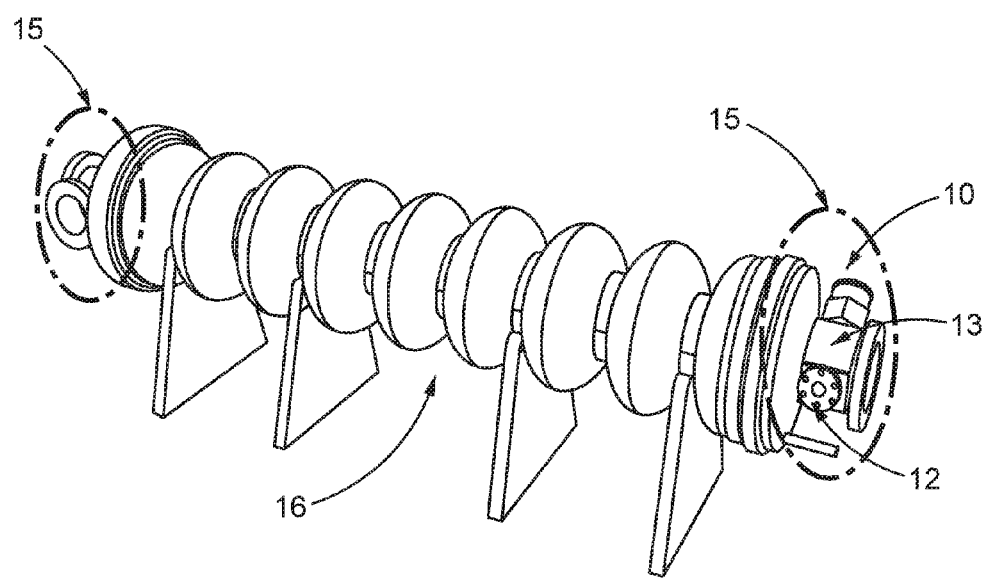
FIG. 1 is an appearance of a superconducting accelerator cavity unit.

As previously mentioned, the first issue to be solved in the invention is to propose a new press forming method instead of the conventional method of subjecting a rod material to machining (full machining method) or the method of combining backward extrusion of a rod material followed by machining and heat treatment (extrusion-machining-heat treatment method) or the method of subjecting a sheet material to plural processes of press forming while conducting heat treatments among them (plural press forming-heat treatment method) as a method of manufacturing end-group components for superconducting accelerator cavity mainly by innovated press drawing.

The 1st Invention developed for solving the above issue is a method of manufacturing end-group components of a cylindrical form from a pure niobium sheet material by press forming composed mainly of flat-bottomed cylindrical parts.

Moreover, the basic technical idea for attaining the first invention lies in that the control of velocity and/or motion of a slide and control of temperature and/or its distribution and gradient of a tool die are simultaneously carried out the press forming described as the first invention (second invention). Moreover, the control of velocity and/or motion of the slide is referred to as "velocity/motion control" and the control of temperature and/or its distribution and gradient of the tool die is referred to as "temperature/its distribution and gradient control" hereinafter.

The second invention will be described below.

As mentioned above, one of the methods for forming/drawing materials hardly subjecting to deep drawing such as austenitic stainless steel and so on is a warm press forming method wherein the property of a material in the course of drawing is improved by warming a flange to diminish work hardening due to strain induced martensitic transformation and reduce the deformation resistance of the flange, and at the same time by cooling the neighborhood of a punch shoulder having the risk of fracture to promote work hardening due to strain induced martensitic transformation. However, since pure niobium does not cause strain induced martensitic transformation, the above technique itself cannot be applied to the present invention.

In general, the drawability of the metallic material to be formed at room temperature (RT) is evaluated by a limiting drawing ratio (LDR) defined by the following equation (1):

$$[LDR] \equiv (D_0/D_p)_{max} \quad (1)$$

wherein $D_0$ is a circular blank diameter and $D_p$ is a punch diameter.

Moreover, it is represented by the following equation (2) in case of a flat-bottomed punch:

$$[LDR] = \{\sqrt{(1+R)/2}\} \cdot \{(1+R)/\sqrt{(1+2R)}\}^n \quad (2)$$

Here, R is an average value of plastic strain ratio r determined by the following equation (3):

$$R = (r_0 + r_{90} + 2r_{45})/4 \quad (3)$$

wherein 0, 45 and 90 are angles from the rolling direction.

The r-value is defined by the following equation:

$$r \equiv \epsilon_w/\epsilon_t$$

wherein $\epsilon$ is true strain $\epsilon = \ln(1+\lambda)$, $\lambda$ is conventional strain, and w and t are width and thickness of a single-axis tensile test specimen.

Also, n is a work hardening coefficient obtained from the following σ-ε power relational equation:

$$\sigma = C\epsilon^n \quad (4)$$

wherein σ is true stress=s(1+λ), s is conventional stress, and C is a constant.

On the other hand, the true stress σ in the deformation of a single-phase polycrystalline metal such as pure niobium follows the above equation (4) and at the same time is dependent on deformation temperature T and strain rate (dε/dt) wherein t is a time as mentioned below:

$$\ln \sigma = A + (Q/kT) \quad (5)$$

$$\sigma = K(d\epsilon/dt)^m \quad (6)$$

wherein A, K or m is constant, Q is activation energy, and K is Boltzmann constant. The inventors have examined deformation the behavior of the pure niobium and confirmed the realization of the equations (4), (5) and (6).

Figure 4:
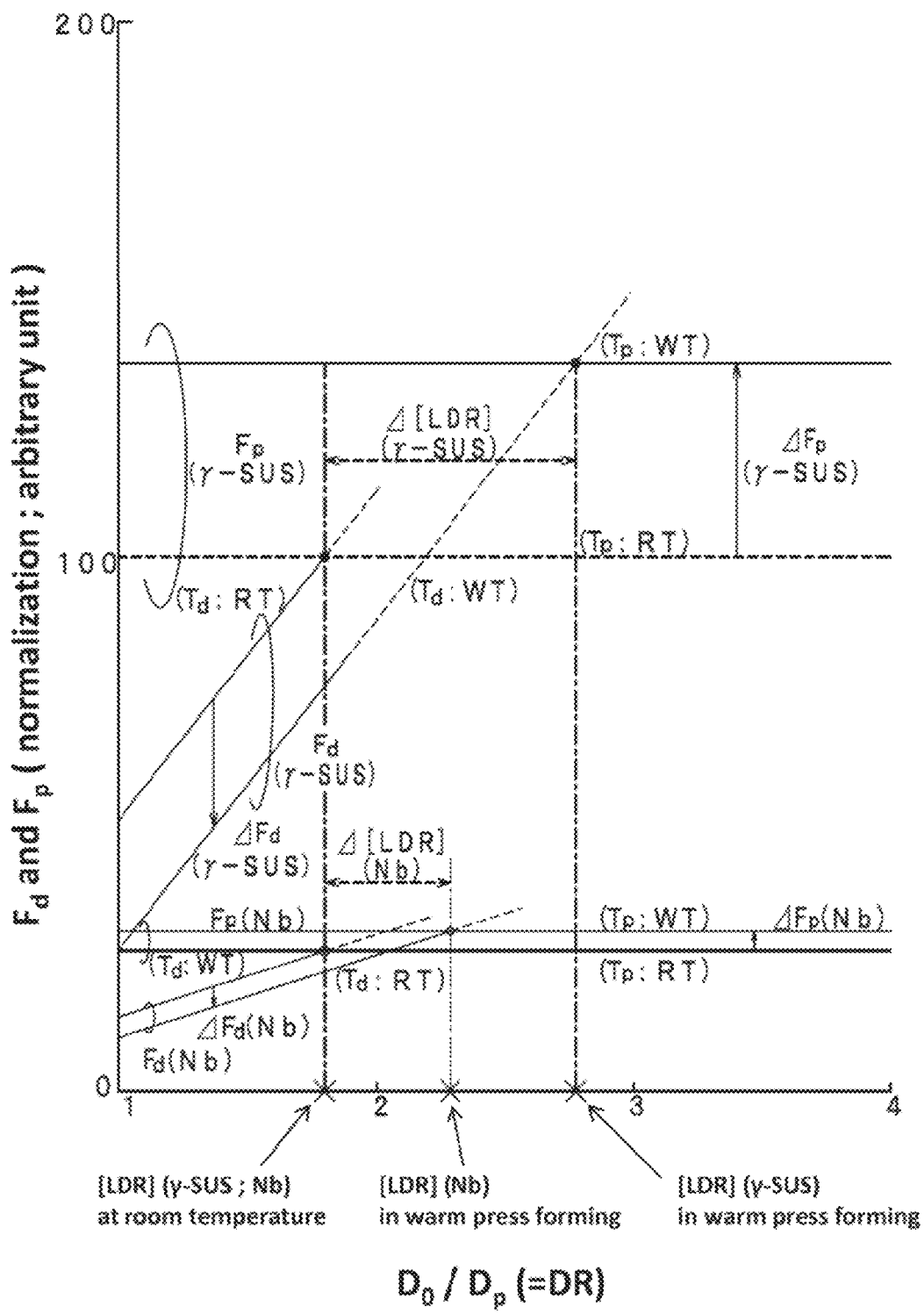
FIG. 4 is a graphic view showing a limiting drawing ratio determined by a change in flange deformation resistance and fracture resistance in the vicinity of a punch shoulder depending on forming temperatures as a comparison between austenitic stainless steel and pure niobium.

Since the pure niobium material is different from the austenitic stainless steel in the deformation mechanism, only a minor effect caused by deformation temperature free from martensitic transformation will be obtained, but the application of the warm press forming to pure niobium has been examined as means of improving its workability compared to that at room temperature. In FIG. 4 are comprehensibly and qualitatively shown experimental results under the basic condition that flange temperature $T_d$: 100° C. and punch shoulder temperature $T_p$: 5° C. are applied to the sheet materials in the flat-bottomed cylindrical press drawing, in which an abscissa is a drawing ratio $[DR] \equiv D_0/D_p$ an ordinate is load of flange $F_d$ and load of punch shoulder $F_p$ as a parameter of flange temperature $T_d$ and punch shoulder temperature $T_p$, respectively.

As seen from FIG. 4, there is a qualitative tendency in the warm press forming that the pure niobium material has an effect similar to transformation-induced plasticity of the austenitic stainless steel. In the FIG. 4, herein, several notations demonstrate the following technical terms, i.e. $F_d$: Deformation resistance of flange; $F_p$: Fracture resistance in the vicinity of punch shoulder; $D_0/D_p$: Drawing Ratio; RT: Room Temperature; WT: Warm Press forming temperature; [LDR]: Limiting Drawing Ratio; γ-SUS: austenitic stainless steel. However, the conventional warm press forming is insufficient in order to achieve the object of the invention for manufacturing the end-group components by press forming composed mainly of flat-bottomed cylindrical drawing.

Moreover, the reason why the punch shoulder is important as a risky position in the drawing is due to the fact that it is apt to easily cause a fracture because it corresponds to a plain strain deformed region in the cylindrical drawing. This is generally said from a forming limit diagram (a graph obtained from the linkage of observed data points equivalent to the fracture in a simple deformation process at the invariable strain ratio ($\epsilon_y/\epsilon_x$)).

Also, the critical fracture stress $\sigma_{cr}$ at such a plain strain deformation state is represented by the following equation (7). It is found from the equation that the influence of r-value of the material upon the drawability is large and that the difficulty of press forming pure niobium material having a small r-value is high.

$$\sigma_{cr} = (2/\sqrt{3})^{1+n} \cdot [\{(1+r)2\}/\{\sqrt{1+2R/3}\}]^{1+n} \cdot \sigma_u(t_0/t) \quad (7)$$

wherein $\sigma_u$ is a maximum true tensile stress and $t_0$ and t are thicknesses before and after forming, respectively.

The inventors have made various studies aiming at significant improvement of the formability of pure niobium sheet based on warm press forming, but specifically considering such inconvenient properties on formability of the pure niobium material that it is much soft, and of lower strength, small work hardenability and r-values, and also large in-plane anisotropy of r-values.

As a result in the first invention, it is concluded that the temperature of the pure niobium sheet material is necessarily sufficient to satisfy 100° C.≤Td≤200° C., −50° C.≤Tp≤0° C. and 100° C.≤ΔT≡Td−Tp≤200° C., while it has been confirmed that the change in the strength of pure niobium by plastic deformation is small. Moreover, if the heating temperature exceeds 200° C., surface oxidation of niobium is apprehensive, while if it is lower than −50° C., performances of a solid coating type lubricant are deteriorated. Also, if ΔT is outside of the above range, the balance between flange deformation resistance and punch shoulder fracture resistance is worsened to lower the formability.

As a result of simultaneously conducting "velocity motion control" of the slide in the second invention with the above "temperature/its distribution and gradient control", it has been found out that the integration of both controls is very important for attaining the target of the invention. In this case, there are two kinds of effects, i.e. the effect of properly adjusting the temperature/its distribution and gradient of the flange and the vicinity of the punch shoulder thereof by stop of the slide, and thus the other effect of decreasing dynamic friction and bringing about the increase of σ in the equation (6), i.e. critical fracture stress $\sigma_{cr}$ through $\sigma_u$ of the equation (7) by increasing the forming velocity of "velocity/motion control".

Figure 5:
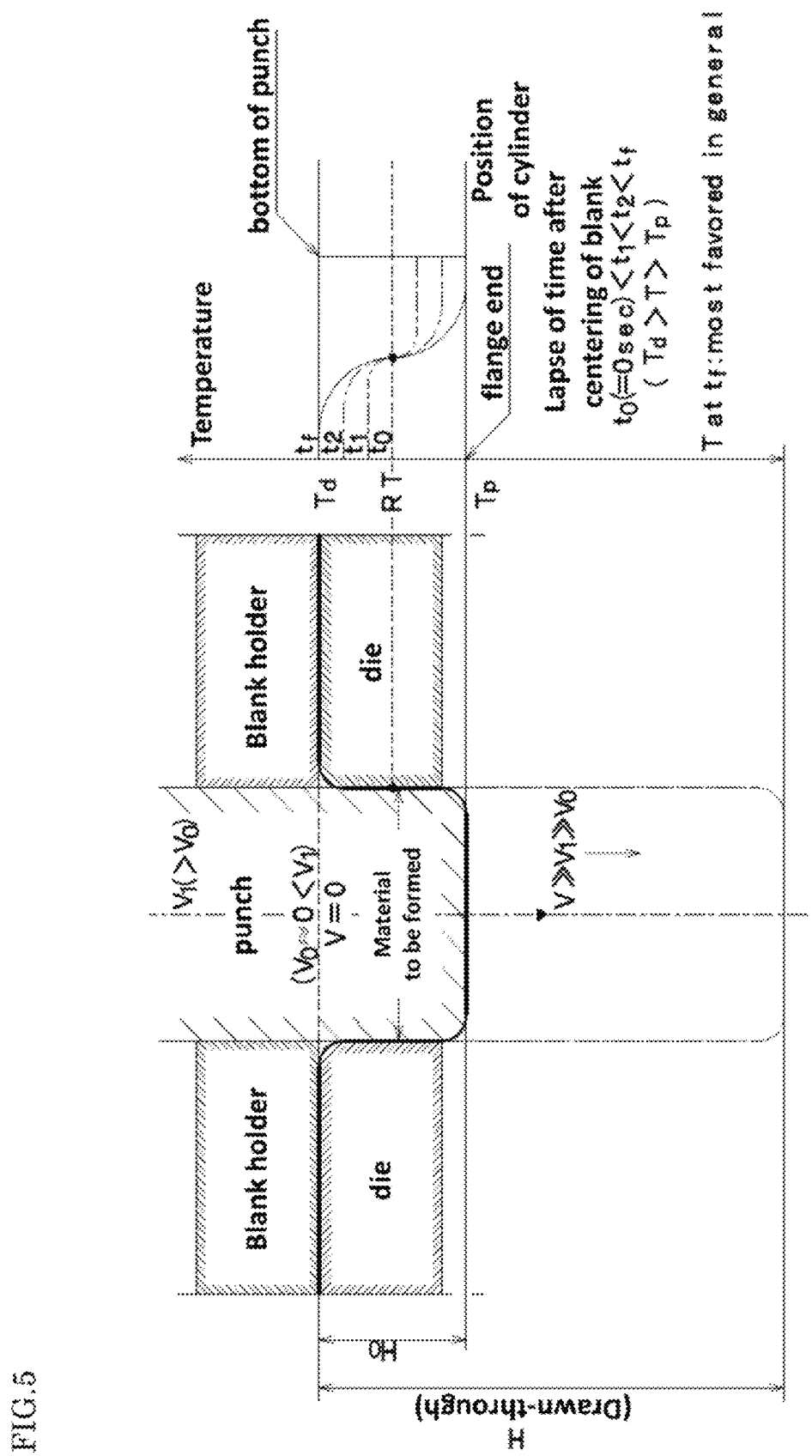
FIG. 5 is a graphic view qualitatively illustrating an influence of slide halting time upon temperature/its distribution and gradient to a cylinder side wall material to be formed.

The effect of the first invention is easily understood from the qualitative view of FIG. 5. That is, the blank is at a state of room temperature in the positioning of the blank, but when the punch and dies are contacted with the blank by low velocity movement of the slide, and then the slide is stopped at a stage of proper shallow drawing, the temperature/distribution and gradient from the flange to the punch shoulder becomes a proper condition for the drawing through thermal condition after also proper halting time, $t_f$ as shown in the Figure. The effect of the second invention related to increasing velocity lies in the possibility that the drawn-through is attained by faster forming as possible immediately after realizing the proper temperature/distribution and gradient. This is based on the total effects that the strength is increased in the vicinity of the punch shoulder and the dynamic friction coefficient of the flange is decreased and the undesirable increase of stress in the flange is eliminated by dynamic control of blank holding force as mentioned later.

Moreover, the press forming method of the invention largely improving the press formability (drawability) by combining the velocity-motion control along with the temperature/distribution and gradient control is to be called "Comprehensive Press Forming (CPF) method" hereinafter as compared to the "conventional room temperature forming", "warm press forming" and the like.

Next, the third invention, i.e. the forming method of dynamically controlling blank holding force in accordance with the change of flange area, thickness, and changes in characteristics of the pure niobium sheet material in the above CPF press method will be described.

As is well-known, it is common to set the blank holding force to a range of causing no fracture of the material in order to prevent wrinkles in the press forming and to keep the firstly applied force constant until the end of the forming (drawing). Then, it is proposed as a "variable wrinkle preventing system" that the blank holding force is dynamically varied during the forming while considering the changes of flange area, material thickness and press forming force associated with the procedure of the drawing. This system has an effect of eliminating factors deteriorating the drawability such as microscopic orientation variation related to r-value of the material and its anisotropy, and macroscopic thickness increase due to dynamic shrinkage flanging, and will enhance the improvement of the drawability.

In the second invention, the improvement of the workability is intended by deliberately uniting the forming velocity and temperature distribution to particularly increase plain strain critical fracture stress $\sigma_{cr}$ at a higher velocity (equations (6) and (7)), while the third invention is concerned with the change of flange deformation resistance (with is dependent on the changes of flange area, material thickness, hardening of material and so on due to the increase in the forming velocity. That is, the consideration is given to the balance of flange deformation resistance stress $\sigma_d$ to plain strain critical fracture stress $\sigma_{cr}$ in view of both effects of decreasing in blank holding force (stress) and increasing in work hardening stress. In the third invention, therefore, the material having a properly controlled temperature/distribution and gradient is formed by controlling the deformation resistance of the flange in terms of flange area, material thickness and work hardening regarding blank holding force during the press forming (added with temperature control as well), which is newly called a "dynamic blank holding force control").

As mentioned above, the flange deformation resistance stress $\sigma_d$ is reduced together with the increase of the forming velocity/critical fracture stress in the press forming procedure of the third invention. And when the forming velocity is increased to N times after proper temperature/distribution and gradient is applied to the material, it is preferable to reduce $\sigma_d$ to about 10/N times. Therefore, it is necessary that the increase of the forming velocity exceeds 10 times. It is preferably not less than 20 times, more preferably not less than 30 times. Here, N times in the increase of the forming velocity is defined as a magnification of the velocity to a common speed (about 5 mm/sec) of the conventional hydraulic press forming (decreasing the velocity by hydraulic control to cope with hardly forming material to a certain extent). This aims at the improvement of drawability/mass productivity and the reduction of cost by both temperature and velocity controls.

Then, the forming method of the forth invention concerning improvement of the anisotropy will be described following to the betterment of the formability by the aforementioned comprehensive press forming (CPM) method.

According to the inventors' research and studies, it has been cleared that the improvement of the anisotropy contributes to that of the formability. The anisotropy in the drawing mainly results from in-plane anisotropy of the material. As a quantitative value R mentioned above r calculated from values (equation 3), and anisotropy parameter, |Δr| defined by the following equation (8):

$$|\Delta r| \equiv |\{(r_0+r_{90})/2\}-r_{45}| \qquad (8)$$

The crystal lattice of niobium is the same body-centered cubic (BCC) as normal steels like SPC etc. However, niobium has characteristics that the plastic strain ratio r largely contributing the drawability and its average value R thereof are small, and the in-plane anisotropy |Δr| is large. This suggests that the drawability of niobium is poor and the anisotropy of the drawn-through body after press forming is large, i.e. the edge irregularity of cylindrical drawn body (which are generally called "ears") is large. The feature that the ear is large means that even if higher ears are equal, lower ears give the smaller height of the body which is actually usable.

For example, SPC normal steel sheet shows R≈2.0 and Δr≈0.5, while the pure niobium exhibits R≈1.0 and Δr≈1.0, and hence both have large differences of about the degree of ½ and 2 times in this regard. Therefore, it is said that the pure niobium is largely poor both in drawability and in-plane anisotropy compared with the normal thin steel sheets, and is a material having a high difficulty in press forming (hardly forming material). Although this is considered to be related to the crystallographic texture resulted from the manufacturing conditions of the pure niobium material, the invention mainly aims at the improvement of drawability and its isotropy by the development of new press forming method without considering basically the improvement of currently produced Nb material properties themselves.

There is a "separate blank holding method" already proposed to lesson anisotropy in the drawing. This is conducted by separating a blank holder to control blank holding force on each site of the flange independently, and is a process when the blank holding force tends to become non-uniform by the single blank holding of this method due to large in-plane anisotropy. In addition, the dependence of r-value causing the non-uniform blank holding force on angle θ from rolling direction changes continuously and delicately, so that it is difficult to properly the separate blank holder for achieving the appropriate control. Especially, it is usual that r-value/θ relation is subtly different even among materials produced in the same charge, then vigorous labor and cost are taken when the above procedure is applied to mass production.

Hence, "proper anisotropic blank (non-circular for cylindrical drawing)" proposed in the fourth invention is developed for reducing the ears size resulted from the anisotropy in the cylindrical drawn body of the end-group components for superconducting accelerator cavity.

In general, circular blanks are used for cylindrical drawing. Because, earring is not caused when the material is isotropic. However, the plastic strain ratio r-value of the actual pure niobium material has a strong dependence on angle ($\theta$) from the rolling direction as compared to the normal steel sheet, resulting a large planar anisotropy. When the material having an planar anisotropy is subjected to drawing, the change of thickness is small in the direction showing large r-value, but is large in the direction showing small r-value. In case of the cylindrical drawing, therefore, the flange shrink deformation is caused in the circumferential direction and thickness direction, while the flange stretch deformation is caused in the radius directions. So that the increase of the thickness is caused in the large r-value direction to result in the materials stretch deformation into the radius direction to thereby form a higher ear, while in case of the small increase of the thickness in the small r-value direction, the less amount of material's stretch deformation into the radius direction forms a lower ear.

Therefore, when the circular blank is modified in view of previous consideration of a deformation behavior, it is expected that the generation of ears can be reduced after forming. In the invention, the blank of the pure niobium sheet material is determined to be an anisotropic blank in shape and size calculated from the measured values of plastic stain ratio, r, and a power hypothetical equation (9):

$$D_\theta = D_0 (r_{45}/r_\theta)^J \quad (9)$$

wherein $D_\theta$: a blank diameter in a direction of an angle $\theta$ from the rolling direction, $D_0$: a blank diameter in 45° direction from rolling direction, $r_\theta$: plastic strain ratio in a direction of an angle $\theta$ from the rolling direction, J: constant.

Here, the above equation (9) is based on the concept that the blank diameter $D_\theta$ in an angle $\theta$ direction from the rolling direction could be calculated by power of a ratio of r-value in an angle $\theta$ of 45° from the rolling direction ($r_{45}$) to r-value in arbitrary $\theta$ direction ($r_\theta$) from the aforementioned mechanism of anisotropical earring.

Moreover, J is a constant of power determined by the anisotropy of the material to be formed which is varied in accordance with materials, their production processes and other factors. It is generally within a range of 1/10~1/13 in case of pure niobium sheet. As mentioned later, the constant J bringing about difference between higher and lower ears, $\Delta E \approx 0$ in the pure niobium sheet in Invention Examples is 1/11.5.

An example of the method for determining shape/size of the anisotropic blank is described below.

Step 1: By choosing a specimen from each lot of the material, $r_\theta$ (r-value in a direction of an angle $\theta$ from the rolling direction of 0°) is actually measured, for example, every 15° (the measurement of r-value is performed by the use of a method described in JIS Z2254).

Step 2: After the reliability of the above r-value is verified (confirmation of reproducibility, adjustment of $\theta$ interval etc.,) and the data are applied to the least-square method, then $\theta$-$r_0$ relationship is determined by the three-dimensional B spline interpolation method.

Step 3: Since niobium is body-centered cubic, $r_{45}$ takes a minimum value, so that normalization is carried out so as to provide circle blank diameter $D_0 = D_{45}$. And the above equation (9) is applied for determining blank diameter $D_\theta$ in $\theta$ direction, then the shape/size of the anisotropic blank is calculated from the above J value and the semi-empirical values of $r_\theta$ (as mentioned above, $D_\theta = D_0$ is to be the basis in $\theta = 45°$).

Figure 6:
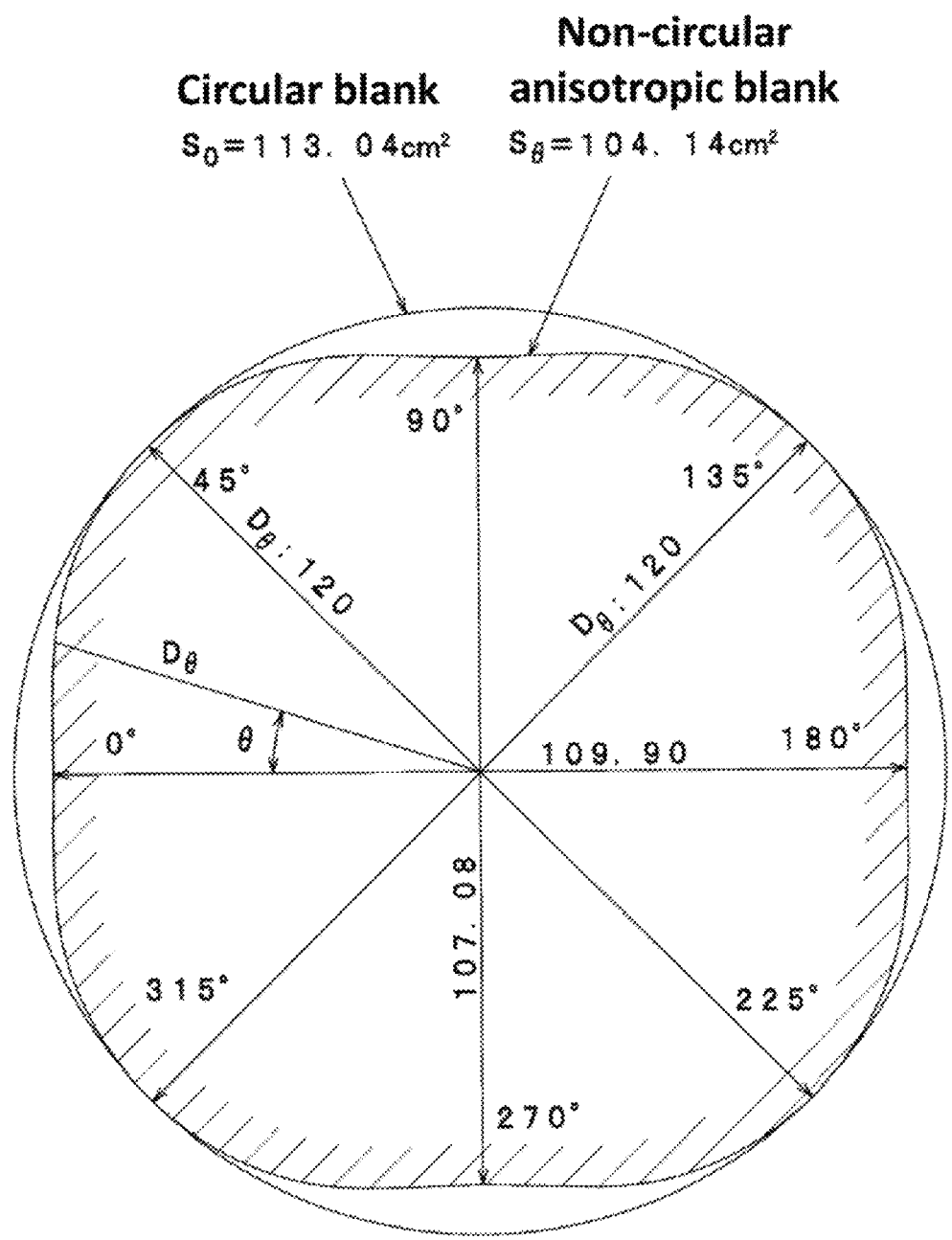
FIG. 6 is a compared view showing a circular blank and a non-circular anisotropic blank related to the invention.

An example of thus determined anisotropic blank is shown in FIG. 6 together with the conventional circular blank. In the drawing of such an anisotropic blank, "four ears" appeared in circular blank are divided and further become almost isotropic, and also the flange deformation stress $\sigma d$ is particularly uniformed in the circumferential direction to improve the formability. Furthermore, it is effective to avoid delayed fracture that is tend to be caused at (lower) edges of a deep drawn body due to stretch residual stress and notch effect.

Figure 7:
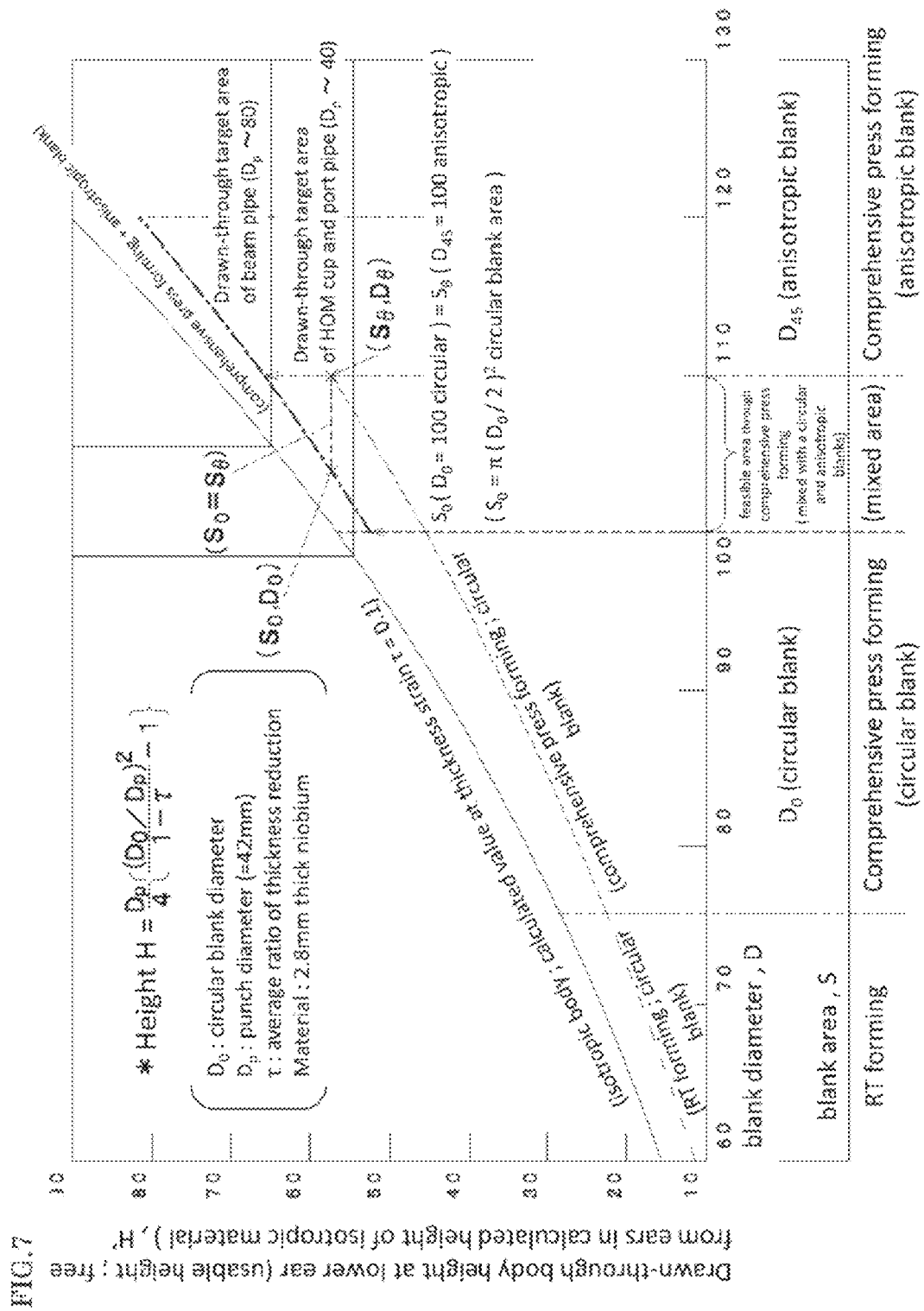
FIG. 7 is a view quantitatively illustrating an influence of press forming method, blank shape and size upon an operable height.

FIG. 7 shows an influence of blank shape/size upon forming height of lower ears in flat-bottomed cylindrical drawing or effectively usable forming height together with targeting forming height area required for producing HOM cup or beam pipe in the end-group components for superconducting accelerator cavity by the press forming method of the invention and the conventional room temperature forming method in comparison with each other. Moreover, both of the above two forming methods are based on the press forming in case of a single process.

As seen from this figure, it is quite impossible to achieve the target of forming height required for designed HOM cup or beam pipe height by the conventional room temperature press drawing. Also, when using the press forming of the third invention conducting the velocity/motion control, temperature/distribution and gradient control and dynamic blank holding force control, the significant improvement of the formability is obtained even implementing the circular blank, but the forming height in the lower ears does not reach to the target height resulting from the low r-value and large anisotropy of the pure niobium material. On the contrary, when using the press forming of the forth invention implementing the anisotropic blank determined from the measured values of r and the power hypothetical equation (9), the sufficient effect is obtained to sort out the anisotropy problem and the target height can be attained without heat treatment. In FIG. 7, herein, the additional notes for further understanding of the invention should be mentioned as follows: area of anisotropic blank determined by $S_\theta = f(D_\theta)$; in general, $D_0$ determined from $S_0 = S_\theta$ comes to $D'_0$; the fact of $D_0 > D'_0$ shows better formability to indicate the favor of the anisotropic blank application; finally H' ($S_0$) < H' ($S_\theta$) relation holds true.

In the comprehensive press forming invention, it is preferable to use a water-soluble dry solid coating type lubricant wherein a temperature change in kinetic viscosity between −50~+300° C. is within ±10% (fifth invention). Here, the reason why the temperature range is from −50° C. to +300° C. is due to the fact that a tooling die temperature is controlled within the above range in the invention. As the water-soluble dry solid coating lubricant may be preferably used as a lubricant disclosed in Patent Document 2 because a kinetic viscosity at 40° C. is 1.83 mm²/sec and this value is substantially unchangeable from room temperature to about 800° C. Moreover, an organic compound film such as Teflon is a lubrication substance indicating a good lubrication performance within a wide temperature range, but it has difficulties in the cost and handling during forming press.

The above is described with respect to the press forming (drawing) of part of end-group components for superconducting accelerator cavity, and it is necessary that in order to make the drawn-through body finally accurate, the shape fixability and size tolerance (thickness, inner diameter, circularity, cylindricality) are within specified ranges in addition to the usable height.

In the sixth invention, therefore, the formed body subjected to the above comprehensive press forming needs restriking process from a viewpoint of shape fixability. In general, the restriking after the press forming has been basically conducted. Herein the drawn-through body formed by the invention is characterized by considerably increased margin in post deforming such as the restriking and/or secondary forming due to uniformed strain distribution and lowered dislocation density.

By subjecting the end-group components obtained by the comprehensive press forming of the invention to restriking process at room temperature at a rate of 5 mm/sec, both shape and size accuracies could be obtained to be acceptable designed requirements, respectively.

Figure 8:
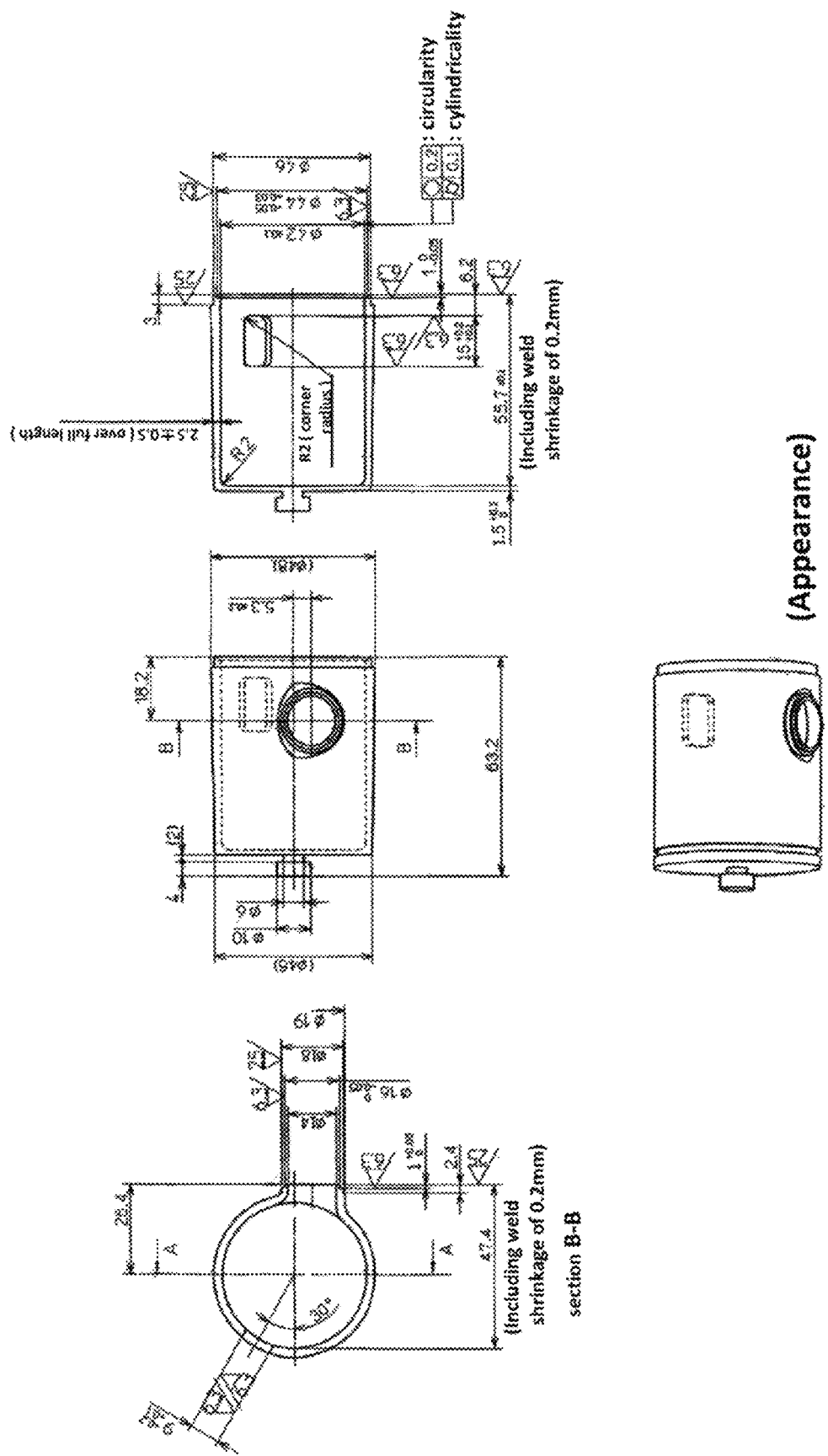
FIG. 8 is the designed specifications of HOM cup as a one of end-group components for superconducting accelerator cavity.

FIG. 8 shows a designed specifications of HOM cup as one of the end-group components for superconducting accelerator cavity, wherein the whole thickness of the formed body is specified to be 2.5±0.5 mm, the accuracy of the inner diameter 42±0.1 mm, the maximum circularity 0.2 mm and the maximum cylindricality 0.1 mm. The fixability was afraid of their satisfaction compared to the conventional press forming with plural processes heat treatment method. In the press formed product of the invention, however, all specifications could be met by restriking. This is interpreted mainly owing to the favored function of die temperature/distribution and gradient control. Namely, considering from a viewpoint of the material deformation, it is speculated that the formed product of the invention obtained by properly adjusting the temperature distribution and temperature gradient causes relatively uniform strain, hence the residual deformation margin to subsequent restriking is enough to provide good shape fixability and size accuracies.

The seventh invention is a forming method wherein any one of secondary forming selected from trimming, protruding of center in flat bottom and burring followed to off-center perforation is conducted after ultra deep drawing followed by restriking. In the invention, the aforementioned press forming and subsequent restriking are called "primary forming", and the resulting formed product is called "primary formed product".

In case of HOM cup shown in FIG. 8 as a target in the invention, it is necessary that the primary formed product after deep drawing followed by restriking is subjected to protruding of center in flat bottom, and to off-center perforation followed by burring as "secondary forming."

Even in this aspect, it was speculated that primary formed product of the invention was severe by deformed to the secondary forming similar to products manufactured by the conventional full machining, extrusion-machining—heat treatment or plural processes press forming-heat treatment. However, when the primary formed product of the invention after ultra-deep drawing and restriking is subjected to the above secondary forming, it could be formed into the shape/size of a final product designated in FIG. 8 without any heat treatment. This is reasonably understood due to the fact that considering the temperature of the material to be deep drawn-through in the primary process of the invention (see FIG. 5), the side wall is formed at temperature/distribution and gradient above room temperature, and the vicinity of the flat bottom is deformed at a lower temperature than room temperature under relatively mild further stress and strain margin, and also the material itself is soft, so that deformation margin still favorably remained.

The eighth invention will be described below.

Figure 9:
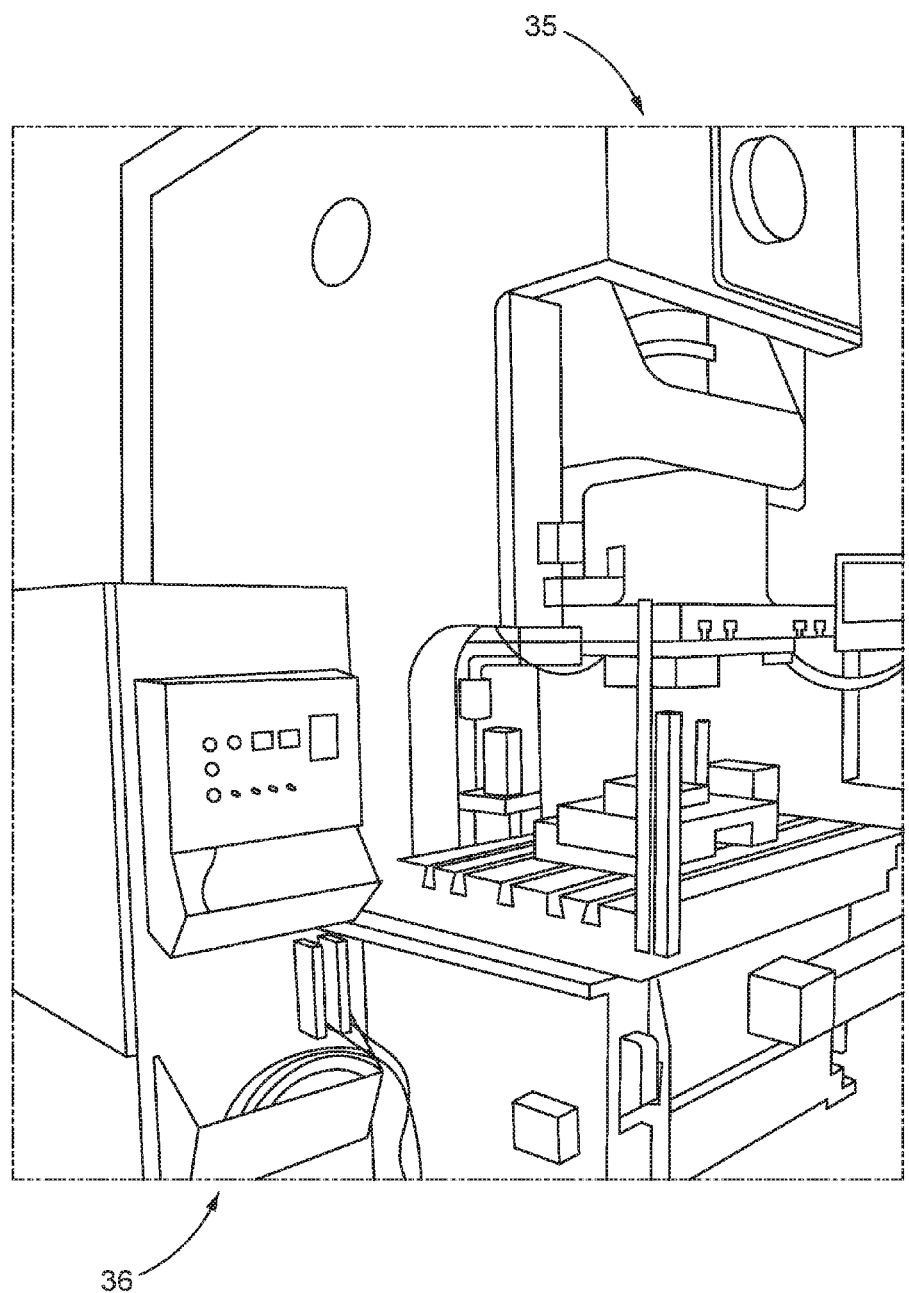
FIG. 9 is a photographic view of a servo-press machine and a temperature control equipment used in press forming according to the invention.

In order to conduct the comprehensive press forming of the invention as mentioned above, the press forming of mainly a single drawing process needs a press machine provided with a servo mechanism capable of controlling speed and/or motion of a slide and a temperature control equipment capable of controlling temperature/distribution and gradient of a tooling die (two systems of heating and cooling). As an example, the appearance of a servo press machine is shown in FIG. 9

In addition to the servo mechanism and temperature control equipment the above servo press machine is essential to be provided with a servo die cushion capable of dynamically controlling the blank holder force and a tooling die. Moreover, if the servo press machine is not available, the servo mechanism can be installed to the conventional press machine.

As previously mentioned, since the pure niobium is of a hard formability, the end-group components for superconducting accelerator have hitherto been manufactured by the whole machining, extrusion-machining-heat treatment or plural press forming-heat treatment procedures. Whereas, according to the comprehensive press forming of the invention, it is possible to manufacture a pure niobium component sheets by press drawing on a single process.

Further, the restriking after the ultra-deep drawing or further subsequent secondary forming such as trimming, eccentric piercing, burning or bottom protruding can be conducted without depending upon the conventional machining, welding or heat treatment. The main reason why the press formed product of the invention is excellent in the restriking performance and secondary formability is due to the fact that metallographic structure and deformation morphology are uniformly and favorably deformed during each process.

According to the invention, therefore, the end-group components for superconducting accelerator cavity can be manufactured by using the pure niobium sheets as a starting material and applying the press forming from beginning to end. The main process is summarized by "ultra-deep drawing by press forming"→"restriking for giving shape/size accuracy" (which are "primary forming")→"secondary forming".

Although the above is described with respect to the method of manufacturing HOM cup among the end-group components for superconducting accelerator cavity, the press forming of the invention can be sufficiently applied to the manufacture of port pipe and beam pipe.

Example 1

There will be described an example of applying the comprehensive press forming method of the invention to the primary forming/drawing in the end-group components for superconducting accelerator cavity.

Figure 10:
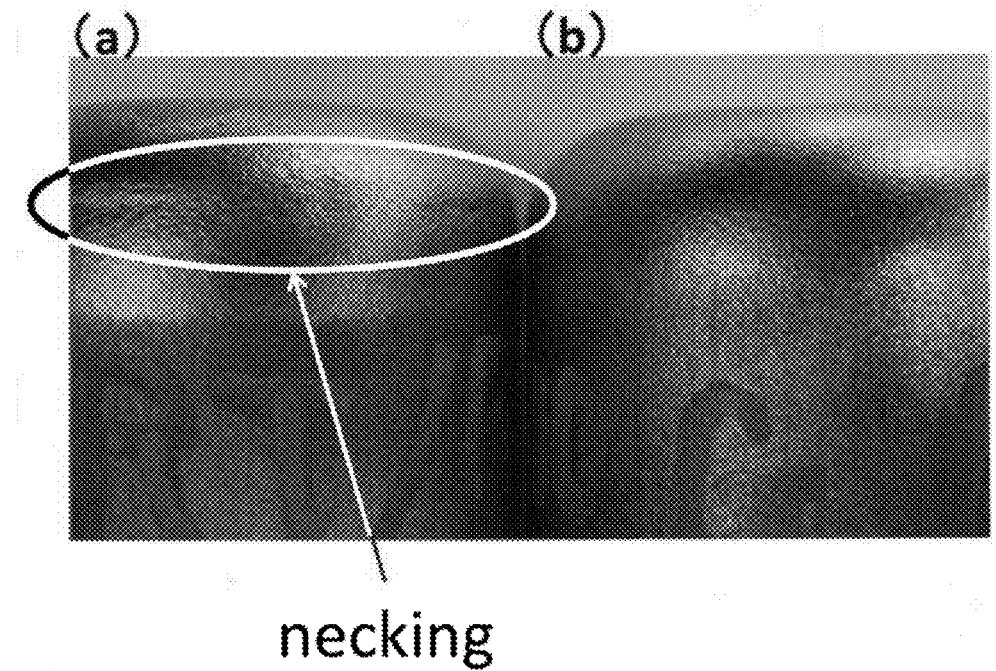
FIG. 10 is a photographic view of an influence of forming method upon surface deformation on the vicinity of punch shoulder corresponding to fracture risk sites in flat-bottomed cylindrical drawing under the same drawing ratio.

FIG. 10 shows results obtained by drawing a pure niobium sheet of 2.8 mm in thickness with a circular blank of $D_0$: 76 mm on a flat-bottomed cylindrical punch of $D_p$: 42 mm using a servo press machine shown in FIG. 9 (the same hereafter). FIG. 10(a) is a forming example wherein necking is caused in the vicinity of the punch shoulder by forming at room temperature and a rate of V: 5 mm/min to show a state just before fracture, and subsequently fracture was caused by progress of a stroke of about a few mm. Also, FIG. 10(b) is a drawing example wherein the same circular blank of the pure niobium sheet by temperature control of $T_d$: 120° C. and $T_p$: −20° C. and then stroked down by about 10 mm (the drawn height/depth is shown by "h" hereafter) at a forming rate of V: 5 mm/sec, contacted with the punch, then stroke was stopped for 5 seconds in order to adjust temperature distribution and gradient of the material along with stress relief (the stopping time is indicated by "t" hereafter), and subsequently the forming is proceeded at V: 5 mm/min and stopped at the same drawn height as in the above conventional drawing at room temperature. In the latter case, no necking is caused in the vicinity of the punch shoulder, and the material is drawn-through by subsequent progress of the stroke (drawn height at the lower earring is 27 mm). As seen from these results, there is a clear difference in the formability between the conventional drawing at room temperature and constant forming velocity and the comprehensive press forming of the invention featuring the tooling die temperature/distribution and gradient control and the slide velocity/motion control.

Figure 11:
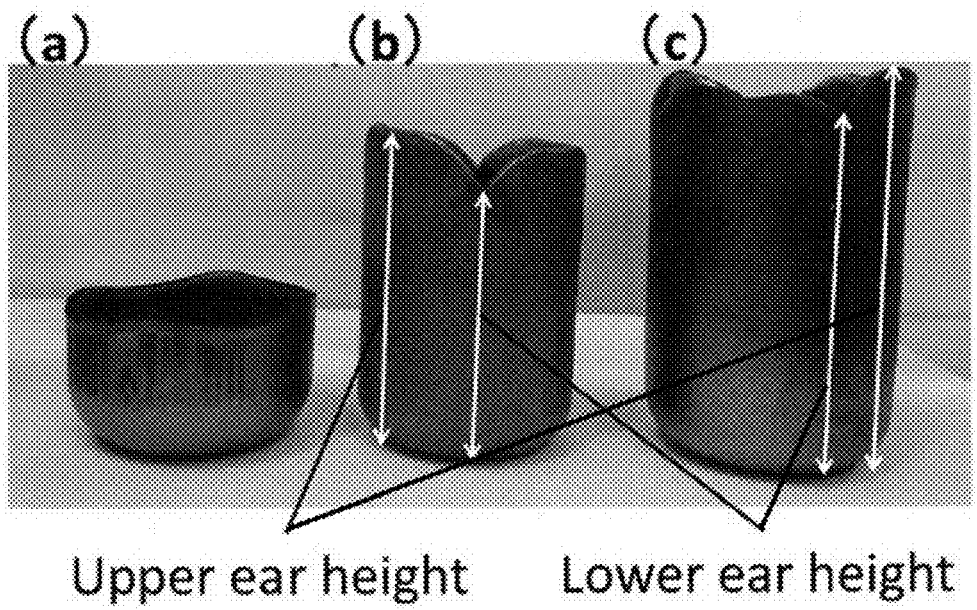
FIG. 11 is a photo view of an influence of forming method upon a height of a drawn-through body and the earring.

Also, FIG. 11(a) shows a drawn-through body ($D_0$: 75 mm) when circular blanks of various diameters are drawn from the pure niobium sheet of 2.8 mm in thickness with a flat-bottomed cylindrical punch of $D_p$: 42 mm at room temperature and forming velocity of V: 5 mm/sec. FIG. 11(b) is an example of the drawn-through product obtained by the comprehensive press forming of the invention wherein firstly, the pure niobium sheet of 2.8 mm thick is blanked to be a circular shape of Do: 100 mm then a flat-bottomed cylindrical tooling die containing a punch of $D_p$: 42 mm is employed to draw the blank up to h: 10 mm under the conditions of controlled temperature of Td: 120° C. and Td: −20° C. at V: 5 mm/sec followed by stroke-halt for t: 5 seconds (V: 0); Secondly, subsequent forming is performed to realize much better drawability under decreased flange deforming stress $\sigma_d$ due to the above thermal conduction and increased fracture stress in the vicinity of punch shoulder as well as decreased dynamic friction coefficient due to higher stroke velocity V: 100 mm/sec, meaning to adjust the appropriate balance between $\sigma_d$ and $\sigma_f$ (fracture stress around punch shoulder). FIG. 11(c) is an example of the product obtained by the comprehensive press forming of the invention wherein an anisotropic blank of $D_{45}$: 110 mm and $D_\theta = D_0 (r_{45}/r_\theta)^J$ (J: 1/11.5, $D_0$: 110 mm) is employed under the fundamentally the same conditions as in FIG. 11(b).

As to the effectively usable forming height of lower earring in the three examples shown in FIGS. 11(a)~11(c), fixing the product formed at room temperature in FIG. 11(a) as a standard, there is a large difference of the height between the product formed at room temperature and the product formed by the comprehensive press forming of the invention irrespective of circular or anisotropic blank, and the latter product is considerably excellent. In addition, the heights of earring are significantly varied by the shape/size of the blank and are prominent in the anisotropic blank.

Figure 12:
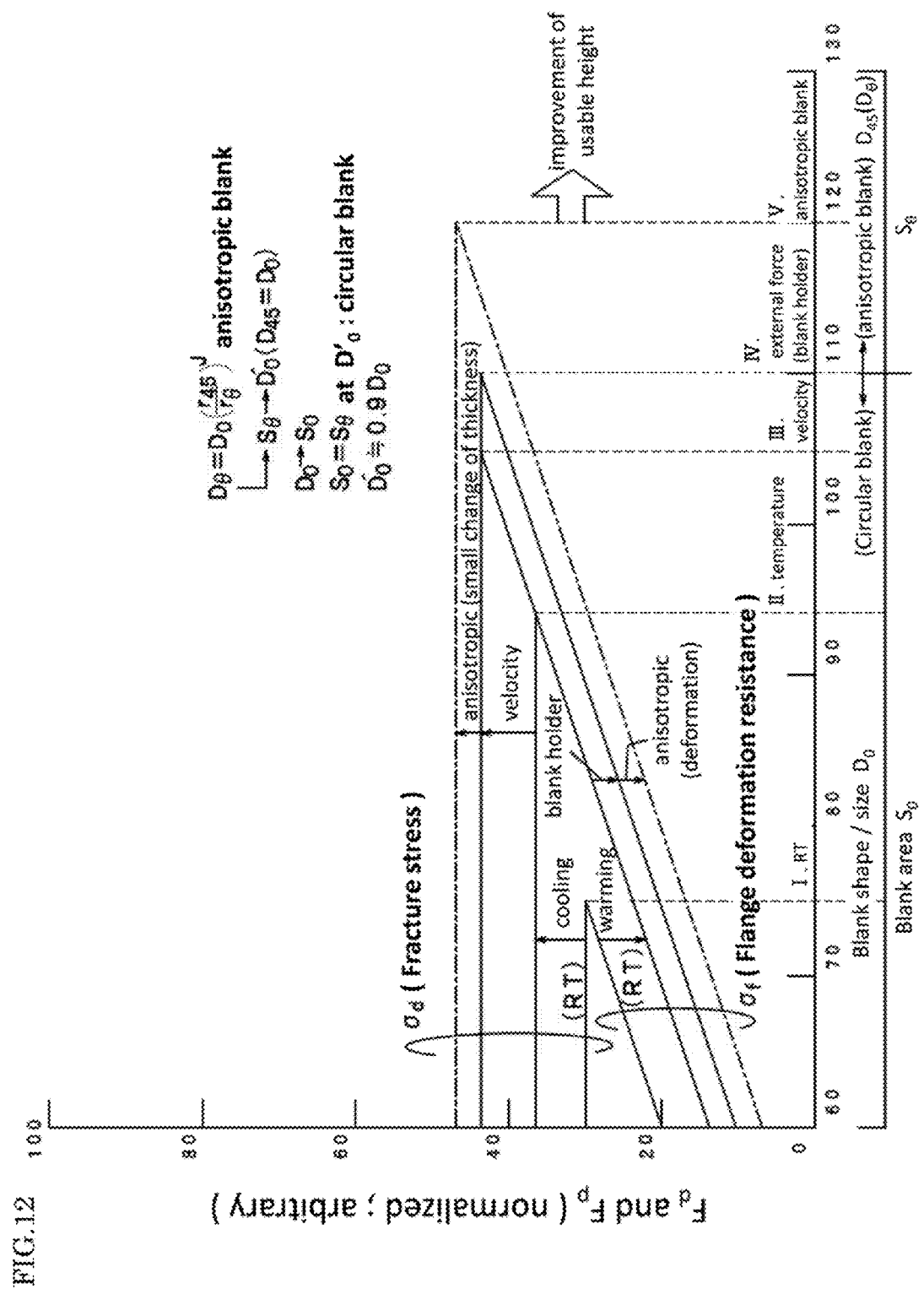
FIG. 12 is a view quantitatively illustrating an influence of forming temperature, blank holding force, blank shape/size upon the load of flange $F_d$ and the load of punch shoulder $F_p$, i.e. their influences on drawability.

In FIG. 12 are semi-quantitatively summarized factors exerting on the formability in the press forming. As seen from this figure, the effect is recognized in the pure niobium material to a certain extent as shown in FIG. 7 even by temperature control of Td and Tp known as the warm press forming, but the manufacture of the end-group components is impossible only by this procedure, and further it is necessary to control temperature distribution and its gradient plus the slide velocity motion control using the servo mechanism. Also, it is important to release the increase of the flange deformation resistance $\sigma_d$, due to the increase of the slide velocity by elevating temperature, and also to rise the fracture stress $\sigma_f$, by lowering the temperature and dynamic blank holding force control. In addition to the above, in order to make possible the increase of forming height by lower earring, reduction of anisotropy and improvement of drawability, it is effective to properly control the blank shape/size, applying the power hypothetic equation based on the orientation dependence of plastic strain ratio in consideration of the planar anisotropy. Although the target by forming in the invention is basically of a flat-bottomed cylinder and the circular blank is usually used, it is effective to convert the circular blank into a non-circular anisotropic one. This is simply called a blank modification (anisotropic blank) in the invention.

Example 2

There will be described an example examined on the influence of planar anisotropy of pure niobium sheet upon blank shape/size and drawability.

Figure 13:
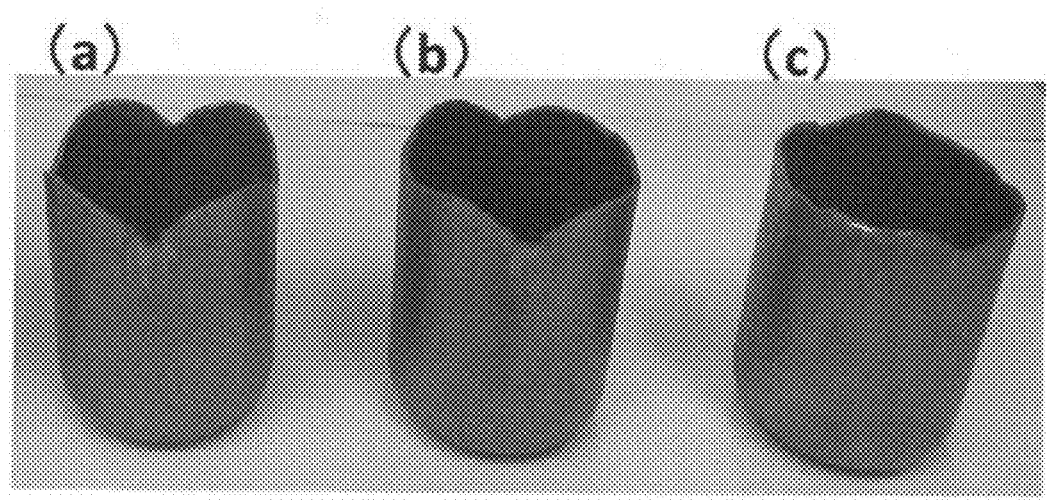
FIG. 13 is a photograph showing an influence of blank shape upon earring of a drawn-through body.

In the three flat-bottomed cylindrical drawn-through bodies shown in FIG. 13, in which the earring on an edge of drawn-through body due to the plastic anisotropy and the angle from rolling direction using a non-circular blank derived from hypothetic power equation with different variables of power index is visually seen, the appearance of mouth edge or the state of earring differs, but the drawing heights are of the same. All of them were drawn by the same comprehensive press forming procedure of the invention as in FIG. 11(c) of Example 1 except for the blank shape/size. As to parameters J of the equation (9), however, the blank of FIG. 13(a) is of J: 0 (circle), FIG. 13(b) is of J: 1/6, and FIG. 13(c) is of J: 1/11.5 (provided that all cases are of $D_{45}=D_0$).

When the results of FIG. 13 are compared with experimental results separately obtained by changing the J values more minutely, negative interrelation of downward tendency is observed between height difference of higher earring and lower earring ($\Delta E$) and J. Herein the earring becomes most isotropical ($\Delta E \approx 0$), when J is 1/11.5. Now, the blanks used in the Invention Examples hereafter are anisotropic ones calculated from J: 1/11.5 in the most cases.

The r-value correlated with the planar anisotropy is determined by the crystal texture of the material and varied depending on an angle θ with respect to the rolling direction. In case of macroscopic drawing, therefore, the deformation state in each of circumferential direction, thickness direction and radius direction of the flange is varied depending on sites inside the blanks/bodies, and also the degree thereof is dependent on the shape/size of the blank.

Figure 14:
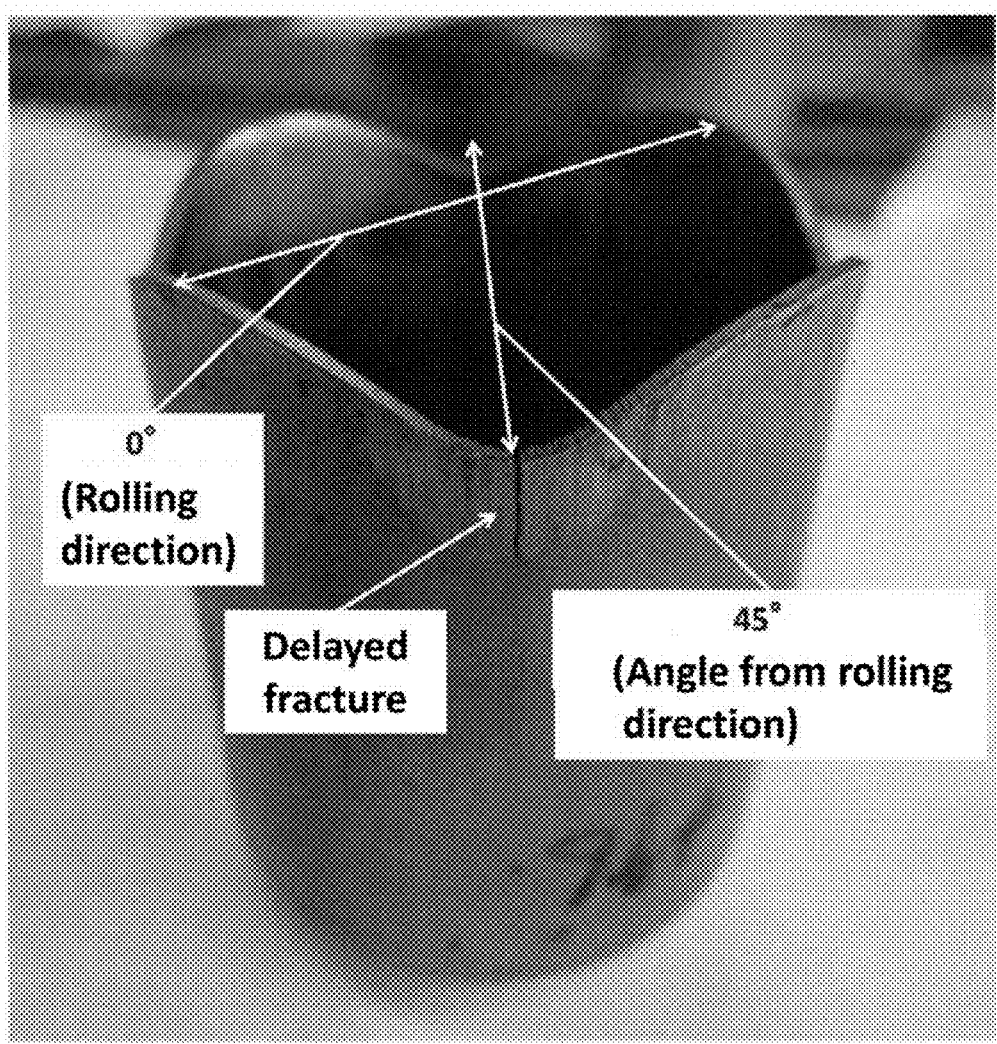
FIG. 14 is a photograph showing delayed fracture generated in a drawn-through body using a circular blank.

FIG. 14 shows a product formed likewise FIG. 13(a) wherein delayed fracture (season crack or longitudinal crack) is caused in the lower ear of the flat-bottomed cylindrical body having four large ears formed by deep drawing using circular blank. It takes place ordinarily several days after forming.

The lower ears correspond to a direction of θ: 45° from the rolling direction and is considered that the tensile strain in the radius direction is smaller to be larger tensile residual stress in the circumferential direction than those of the higher ears, and the geometric notch effect is acted. Both of them happen to bring about the occurrence of delayed cracking. In the drawing of the pure niobium sheet, therefore, it is important to suppress ears resulted from the anisotropy for preventing delayed fractures. In this regard, it is preferable to adopt the anisotropic blank considering the distribution of observed r-values of the material.

From the above example are there the effects by use of the anisotropic blanks in the following points.

(1) The usable height of the cylindrical drawn product is improved by the reduction of ears (isotropic effect).

(2) The drawability is improved in comparison with the circular blank having the same area (see FIG. 7).

(3) The amount of the material required for providing the given usable height of the products can be reduced, so that the cost of the extremely expensive pure niobium for the production can be decreased (approximately over 10%).

(4) The delayed fracture in the mouth edge of the cylindrical drawn-through product can be prevented.

Example 3

Judging from an example of the design view of HOM cup shown in FIG. 8, the shape/size accuracy of the end-group components for superconducting accelerator cavity is severe because of the precise performance of the accelerator required. Hence is the formed body obtained by the comprehensive press forming of the invention is necessitated to be subject to restriking in order to further improve the shape fixability and size accuracy.

Figure 15:
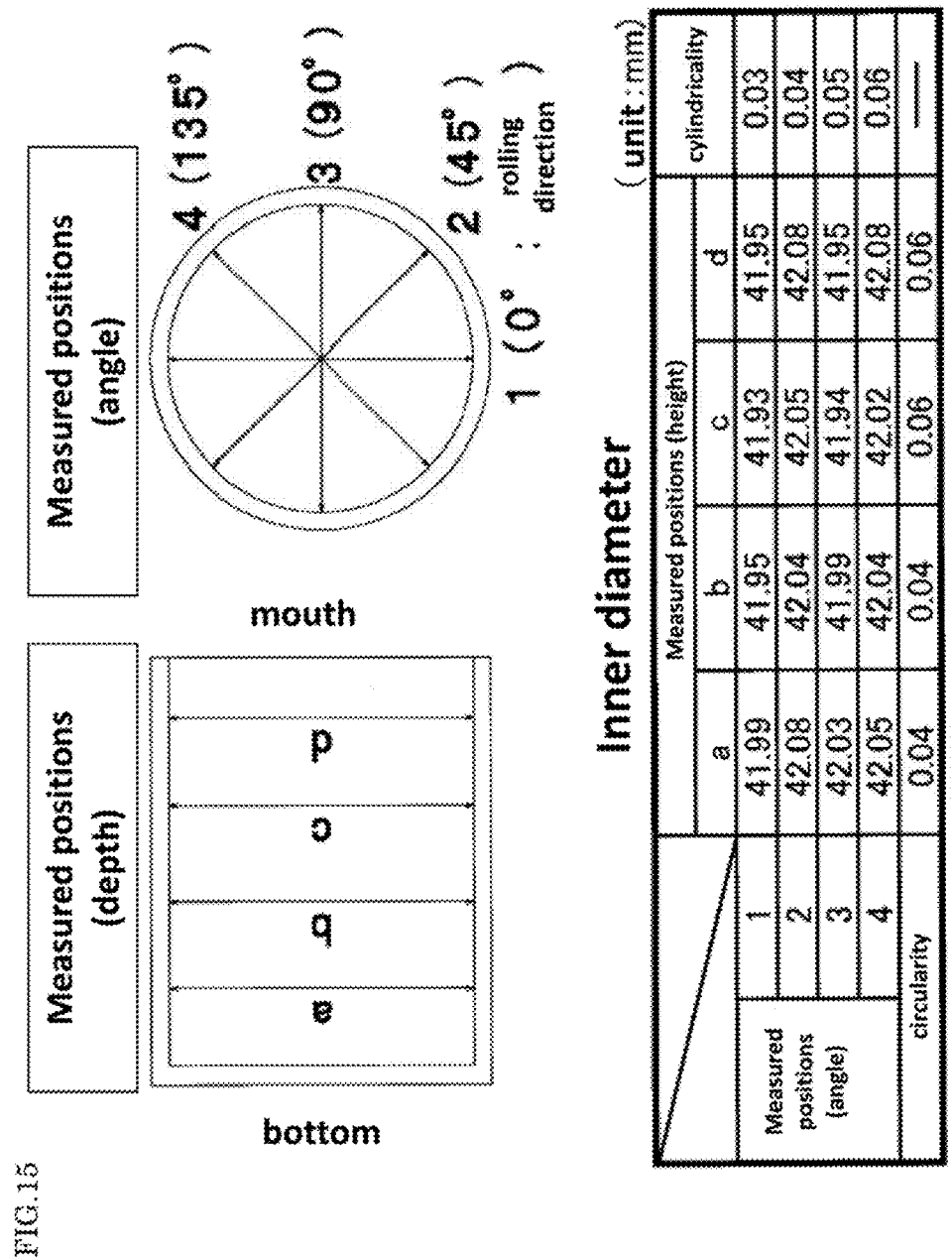
FIG. 15 is a view showing observed circularity and cylindricality after restrinking.

In FIG. 15 are shown results of the circularity (specification: below 0.2 mm) and cylindricality (specification: below 0.1 mm) by measuring inner diameter of a body on the illustrated cylinder subject to restriking that is obtained by drawing an anisotropic blank calculated using J: 1/11.5 made of a pure niobium with a thickness of 2.8 mm through the comprehensive press forming of the invention. Moreover, the circularity is defined as ½ of diameter difference in each radius direction at the same height, and the cylindricality is defined as ½ of diameter difference in each height at the same radius direction. Incidentally, the specification of thickness accuracy in each position is 2.5±0.5 mm, and the inner diameter accuracy is 42±0.1 mm, which are both confirmed to be sufficiently satisfied by the measured results.

As seen from the measured results on the circularity and cylindricality at 16 points in total shown in FIG. 15, these results sufficiently satisfy the above specification (FIG. 8). The reason of obtaining the good shape/size accuracy is due to the fact that the drawn-through body given by the press forming of the invention still has a relative margin of further deformation without conducting heat treatment after forming.

Example 4

Next, there will be described an example the primary formed product obtained by subjecting the anisotropic blank to flat-bottomed cylindrical drawing applying the comprehensive press forming process of the invention followed by restriking is further press formed of as secondary forming.

Figure 2:
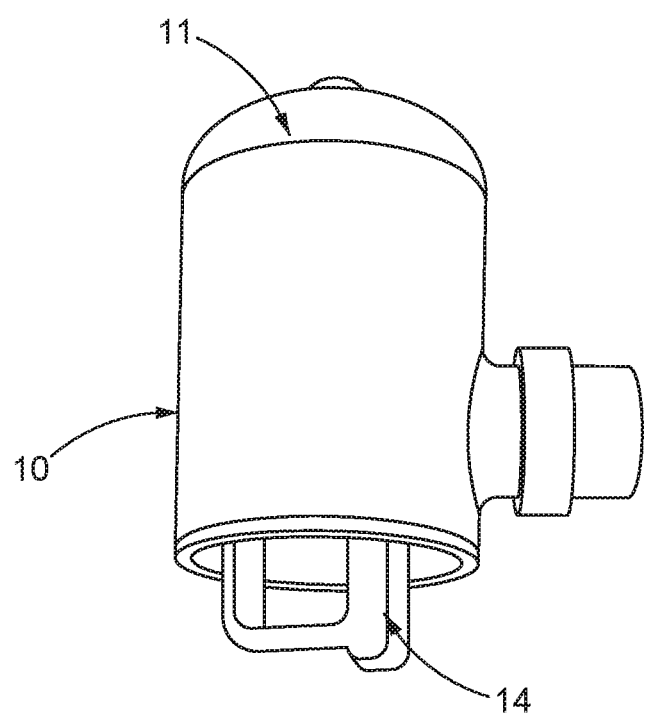
FIG. 2 is an appearance of end-group components in a superconducting accelerator cavity unit.
Figure 3:
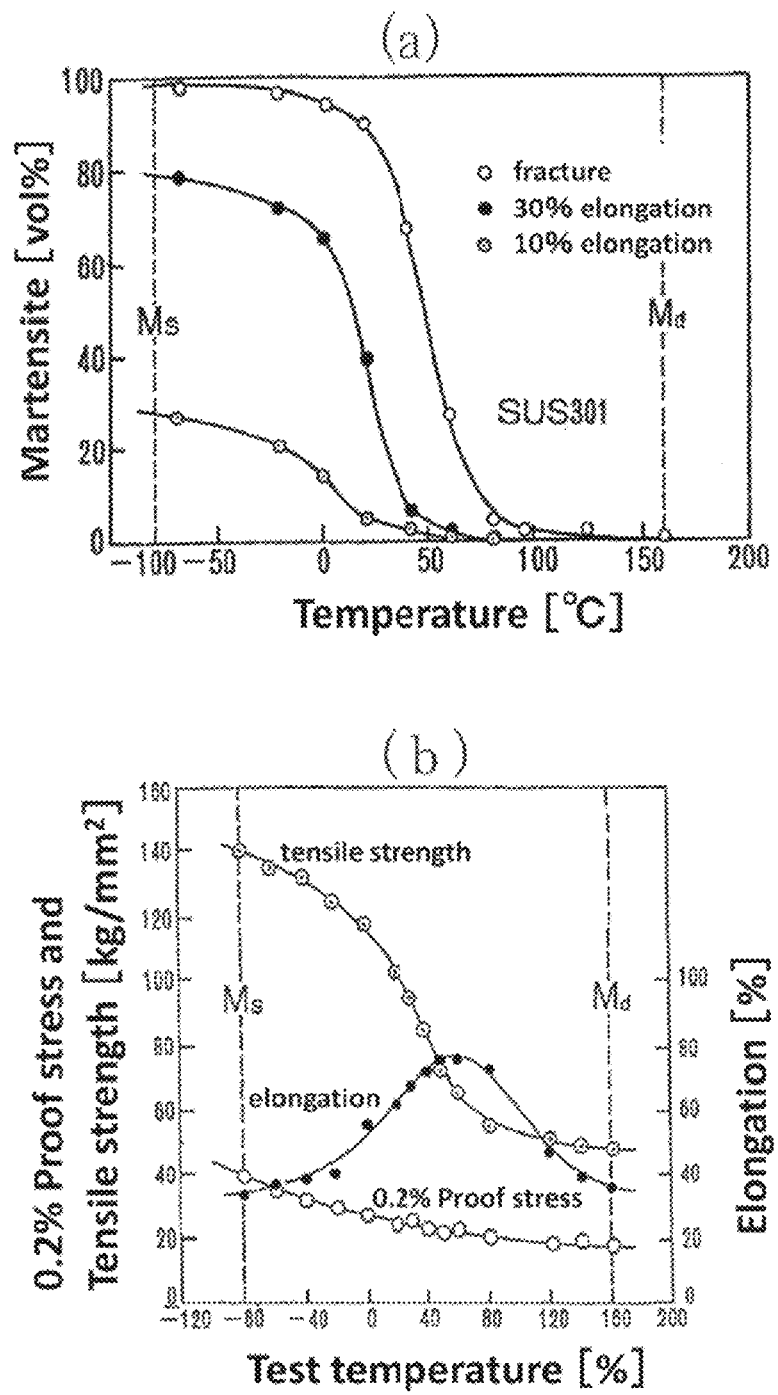
FIG. 3 shows temperature dependence of strain induced martensite and tensile properties in a single-axis tensile test of austenitic stainless steels as a basic phenomenon of a warm press forming.

In order to obtain a final component in the drawing spec of HOM cup in FIG. 8, it is necessary that the primary formed product after drawing and restriking is subjected to the so-called additional secondary forming. Thus, HOM cup functionally displays the targeted superconductivity in the of accelerator cavity. Concretely, HOM coupler is assembled by integrally uniting with HOM antenna by use of electron beam welding (EBW) as shown in FIGS. 1 and 2, which demonstrates cavity function expected together with other end-group components such as port pipe, beam pipe, etc. As the secondary forming are mentioned protruding at flat bottom of the drawn-through cylinder and burring after eccentric piercing.

In FIG. 16 are shown results when the bottom of the HOM cup after restriking (of the primary formed body) is subjected to protruding of about 10φ×6 mm height. This protrusion has hitherto been formed by machining, otherwise by electron beam welding (EBM) a protrusion separately provided by machining in case of the extrusion-machining heat treatment method or plural press forming-heat treatment method.

However, the primary formed body of the invention could be easily protruded by subjecting the bottom of the HOM cup due to pressing for the proper metal flow after preliminary drawing and restriking.

FIG. 17(a) shows results when the HOM cup after the protruding is subjected to eccentric piercing followed by burring. As in the figure, eccentric burring is conducted by thrust force of a piston in a high pressure pump after the piercing at an eccentric position from a central axis on the wall of the cylinder. However, the finishing process is carried out by machining to attain the precise tolerance required shown in FIG. 8.

Since anisotropy is existent in the stretch flanging even after drawing, the above pressing is not easy, in terms of the eccentric perforation. However, the working could be conducted to satisfy the specifications shown in FIG. 8 by properly adjusting the perforation and metal flow around the hole as well as elevating the burring temperature up to about 100° C. This is based on the fact that the stretch flanging of the comprehensive press formed product of the invention has an enough deformation margin without heat treatments after the ultra-deep drawing as compared with the conventional forming. Moreover, FIG. 17(b) shows results examined by color check to investigate infinitesimal cracks caused by the burring, and proved no generation of cracks.

As seen from the above, HOM cup can be massive-produced substantially by the whole press forming processes except for the final machining by using a new comprehensive press forming of the invention without extremely expensive heat treatment.

INDUSTRIAL APPLICABILITY

The technique of the invention is excellent in the deep drawability of hardly worked materials and can be used, for example, as a method of manufacturing seamless pipes with a given length by trimming mouth edge and bottom thereof after the deep drawing applying the invention.

The invention claimed is:

1. A method of manufacturing end-group components for superconducting linear accelerator cavity used in acceleration of charged particles by press forming flat-bottomed cylinders from a sheet material of pure niobium, characterized in that a blank of the pure niobium sheet material is of a non-circular anisotropic shape and size determined from measured values of plastic strain ratio r, and the following hypothetical power equation (9):

$$D_\theta = D_0 (r_{45}/r_\theta)^J \quad (9)$$

wherein $D_\theta$: a diameter of a non-circular anisotropic blank diameter in a direction of an angle θ from rolling direction, $D_0$: a diameter of a circular blank, $r_\theta$: plastic strain ratio in a direction of an angle θ from rolling direction, $r_{45}$: plastic strain ratio in a direction of 45° from rolling direction, J: constant (1/10~1/13).

2. The method of manufacturing end-group components according to claim 1, wherein the control of velocity and/or its motion of a slide and the control of temperature and/or its distribution/gradient of a tooling die and a punch are simultaneously carried out during the press forming.

3. The method of manufacturing end-group components according to claim 1, wherein blank holding force is dynamically controlled in accordance with a change of flange area, its thickness and work hardening of the pure niobium sheet material blank during the press forming.

4. The method of manufacturing end-group components according to claim 1, wherein a lubricant used in the press forming is a water-soluble solid coating type whose variation of a kinetic viscosity depending on temperature between −50° C. and +300° C. is within a range of ±10%.

5. The method of manufacturing end-group components according to according to claim 1, wherein a restriking is conducted after the press forming.

6. The method of manufacturing end-group components according to claim 1, wherein any one of the secondary press forming processes on a body such as trimming, protruding in the center of flat bottom, and perforation at the side wall of a cylinder followed by burring is conducted after the press forming or the restriking.

7. The method of manufacturing end-group components according to claim 1, wherein the press forming is carried out by using a press machine provided with a servo-system installed capable of controlling the velocity and/or its motion of a slide, a dynamic servo-die cushion capable of dynamically controlling the blank holding force, temperature control equipment capable of controlling the temperature and/or its distribution/gradient of the material by means of thermal conduction through the tooling die and punch, and also by employing herein water-soluble solid coating type lubricant and metallic tooling die.

8. The method of manufacturing end-group components according to claim 1, wherein the press forming is carried out on a single process.

9. The method of manufacturing end-group components according to claim 1, wherein the press forming is carried out without heat treatment.

10. The method of manufacturing end-group components according to claim 1, wherein the press forming is carried out by using a punch and a die.

11. The method of manufacturing end-group components according to claim 1, wherein a secondary press forming after press drawing is conducted without any machining process.

* * * * *